United States Patent
Williams et al.

(10) Patent No.: US 11,561,901 B1
(45) Date of Patent: Jan. 24, 2023

(54) DISTRIBUTION OF INJECTED DATA AMONG CACHES OF A DATA PROCESSING SYSTEM

(71) Applicant: INTERNATIONAL BUSINESS MACHINES CORPORATION, Armonk, NY (US)

(72) Inventors: Derek E. Williams, Round Rock, TX (US); Guy L. Guthrie, Austin, TX (US); Bernard C. Drerup, Austin, TX (US); Hugh Shen, Round Rock, TX (US); Alexander Michael Taft, Austin, TX (US); Luke Murray, Austin, TX (US); Richard Nicholas, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 17/394,173

(22) Filed: Aug. 4, 2021

(51) Int. Cl.
*G06F 12/0811* (2016.01)
*G06F 30/32* (2020.01)
*G06F 12/121* (2016.01)

(52) U.S. Cl.
CPC ........ *G06F 12/0811* (2013.01); *G06F 12/121* (2013.01); *G06F 30/32* (2020.01)

(58) Field of Classification Search
CPC ..... G06F 12/0811; G06F 12/121; G06F 30/32
See application file for complete search history.

(56) References Cited

U.S. PATENT DOCUMENTS

| | | | |
|---|---|---|---|
| 8,719,455 B2 | 5/2014 | Mejdrich et al. | |
| 9,176,885 B2 | 11/2015 | Kuesel et al. | |
| 10,055,350 B2 | 8/2018 | Govindaraju et al. | |
| 2010/0235576 A1* | 9/2010 | Guthrie | G06F 12/127 711/146 |
| 2010/0262783 A1* | 10/2010 | Guthrie | G06F 12/12 711/E12.043 |

(Continued)

OTHER PUBLICATIONS

Palutke, R., Ruderich, S., Wild, M., & Freiling, F. (2020). HyperLeech: Stealthy System Virtualization with Minimal Target Impact through DMA-Based Hypervisor Injection. In 23rd International Symposium on Research in Attacks, Intrusions and Defenses ({RAID} 2020) (pp. 165-179).

(Continued)

*Primary Examiner* — Aracelis Ruiz
(74) *Attorney, Agent, or Firm* — Brian F. Russell; Nathan Rau

(57) ABSTRACT

A data processing system includes a plurality of processor cores each supported by a respective one of a plurality of vertical cache hierarchies. Based on receiving on a system fabric a cache injection request requesting injection of a data into a cache line identified by a target real address, the data is written into a cache in a first vertical cache hierarchy among the plurality of vertical cache hierarchies. Based on a value in a field of the cache injection request, a distribute field is set in a directory entry of the first vertical cache hierarchy. Upon eviction of the cache line the first vertical cache hierarchy, a determination is made whether the distribute field is set. Based on determining the distribute field is set, a lateral castout of the cache line from the first vertical cache hierarchy to a second vertical cache hierarchy is performed.

19 Claims, 14 Drawing Sheets

(56) References Cited

U.S. PATENT DOCUMENTS

2011/0161589 A1* 6/2011 Guthrie ............... G06F 12/0811
 711/E12.024
2012/0203973 A1* 8/2012 Guthrie ............... G06F 12/0811
 711/E12.07

OTHER PUBLICATIONS

Farshin, A., Roozbeh, A., Maguire Jr, G. Q., & Kostić, D. (2020). Reexamining Direct Cache Access to Optimize I/O Intensive Applications for Multi-hundred-gigabit Networks. In 2020 {USENIX} Annual Technical Conference ({USENIX} {ATC} 20) (pp. 673-689).

León, E. A., Ferreira, K. B., & Maccabe, A. B. (Aug. 2007). Reducing the Impact of the Memorywall for I/O Using Cache Injection. In 15th Annual IEEE Symposium on High-Performance Interconnects (HOTI 2007) (pp. 143-150). IEEE.

International Search Report and Written Opinion, dated Nov. 3, 2022, 10 pages.

\* cited by examiner

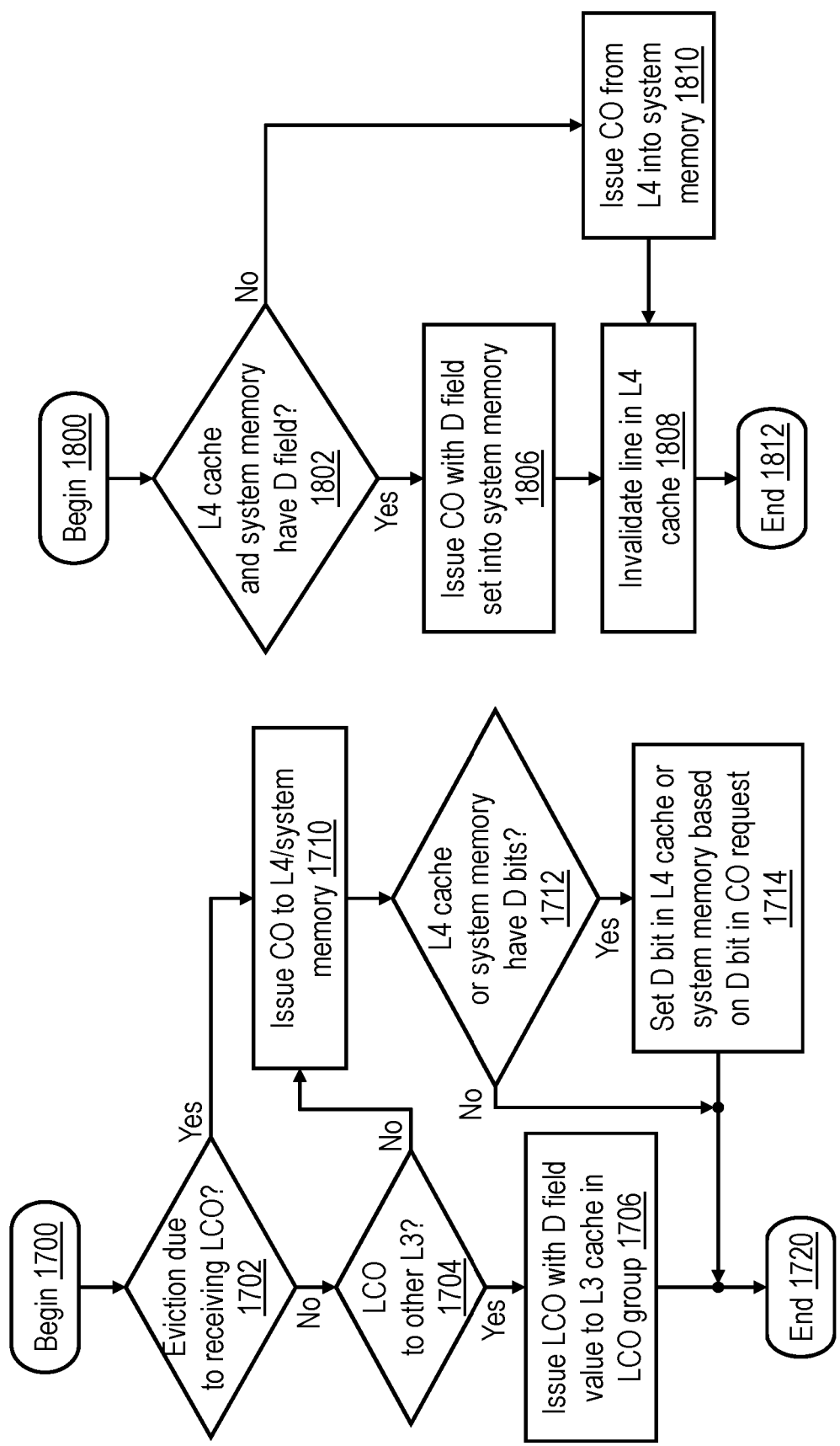

DISTRIBUTION OF INJECTED DATA AMONG CACHES OF A DATA PROCESSING SYSTEM

BACKGROUND OF THE INVENTION

The present invention relates generally to data processing and, in particular, to injection and distribution of data among the caches of a data processing system.

A conventional multiprocessor (MP) computer system, such as a server computer system, includes multiple processing units all coupled to a system interconnect, which typically comprises one or more address, data and control buses. Coupled to the system interconnect is a system memory, which represents the lowest level of volatile memory in the multiprocessor computer system and which generally is accessible for read and write access by all processing units. In order to reduce access latency to instructions and data residing in the system memory, each processing unit is typically further supported by a respective multi-level cache hierarchy, the lower level(s) of which may be shared by one or more processor cores.

Cache memories are commonly utilized to temporarily buffer memory blocks that might be accessed by a processor in order to speed up processing by reducing access latency introduced by having to load needed data and instructions from system memory. In some MP systems, the cache hierarchy includes at least two levels. The level one (L1) or upper-level cache is usually a private cache associated with a particular processor core and cannot be accessed by other cores in an MP system. Typically, in response to a memory access instruction such as a load or store instruction, the processor core first accesses the directory of the upper-level cache. If the requested memory block is not found in the upper-level cache, the processor core then accesses lower-level caches (e.g., level two (L2) or level three (L3) caches) or system memory for the requested memory block.

BRIEF SUMMARY

In at least some embodiments, a data processing system includes a plurality of processor cores each supported by a respective one of a plurality of vertical cache hierarchies. Based on receiving on a system fabric a cache injection request requesting injection of a data into a cache line identified by a target real address, the data is written into a cache in a first vertical cache hierarchy among the plurality of vertical cache hierarchies. Based on a value in a field of the cache injection request, a distribute field is set in a directory entry of the first vertical cache hierarchy. Upon eviction of the cache line the first vertical cache hierarchy, a determination is made whether the distribute field is set. Based on determining the distribute field is set, a lateral castout of the cache line from the first vertical cache hierarchy to a second vertical cache hierarchy is performed.

BRIEF DESCRIPTION OF THE SEVERAL VIEWS OF THE DRAWINGS

FIG. 17 is a high-level logical flowchart of an exemplary method by which a lower level (e.g., L3) cache performs a castout in accordance with one embodiment;

FIG. 18 is a high-level logical flowchart of an exemplary method by which a lowest level (e.g., L4) cache performs a castout in accordance with one embodiment;

DETAILED DESCRIPTION

Figure 1:
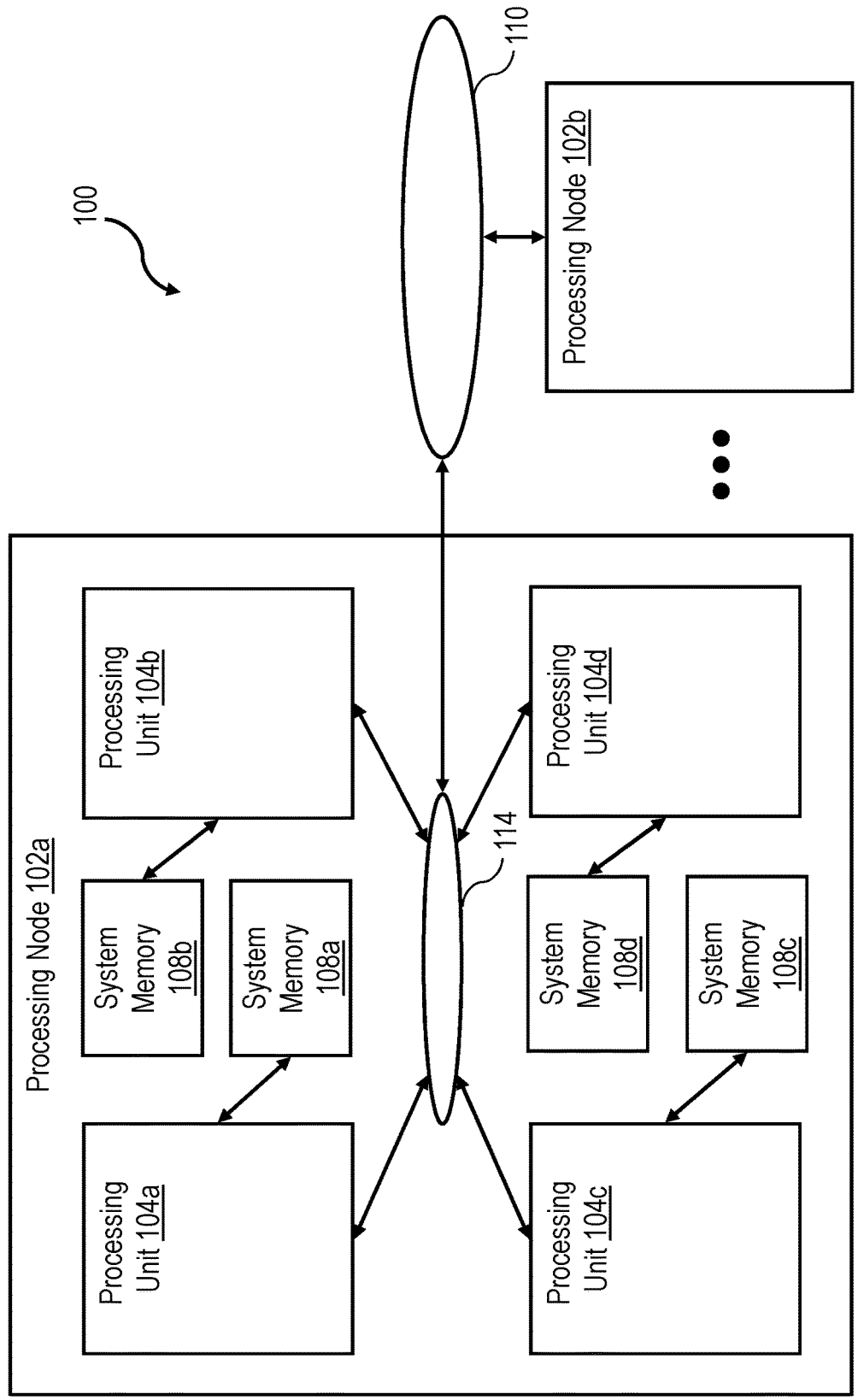
FIG. 1 is a high-level block diagram of an exemplary data processing system in accordance with one embodiment.

With reference now to the figures, wherein like reference numerals refer to like and corresponding parts throughout, and in particular with reference to FIG. 1, there is illustrated a high level block diagram depicting an exemplary data processing system 100 in accordance with one embodiment. In the depicted embodiment, data processing system 100 is a cache coherent symmetric multiprocessor (SMP) data processing system including multiple processing nodes 102a, 102b for processing data and instructions. Processing nodes 102 are coupled to a system interconnect 110 for conveying address, data and control information. System interconnect 110 may be implemented, for example, as a bused interconnect, a switched interconnect or a hybrid interconnect.

In the depicted embodiment, each processing node 102 is realized as a multi-chip module (MCM) containing multiple (e.g., four) processing units 104a-104d, each preferably realized as a respective integrated circuit. The processing units 104 within each processing node 102 are coupled for communication to each other and system interconnect 110 by a local interconnect 114, which, like system interconnect 110, may be implemented, for example, with one or more buses and/or switches. System interconnect 110 and local interconnects 114 together form an interconnect fabric.

As described below in greater detail with reference to FIG. 2, processing units 104 each include a memory controller 206 coupled to local interconnect 114 to provide an interface to a respective system memory 108. Data and instructions residing in system memories 108 can generally be accessed, cached and modified by a processor core in any processing unit 104 of any processing node 102 within data processing system 100. System memories 108 thus form the lowest level of memory storage in the distributed shared memory system of data processing system 100. In alternative embodiments, one or more memory controllers 206 (and system memories 108) can be coupled to system interconnect 110 rather than a local interconnect 114.

Those skilled in the art will appreciate that SMP data processing system 100 of FIG. 1 can include many additional non-illustrated components, such as interconnect bridges, non-volatile storage, ports for connection to networks or attached devices, etc. Because such additional components are not necessary for an understanding of the described embodiments, they are not illustrated in FIG. 1 or discussed further herein. It should also be understood, however, that the enhancements described herein are applicable to cache coherent data processing systems of diverse architectures and are in no way limited to the generalized data processing system architecture illustrated in FIG. 1.

Figure 2:
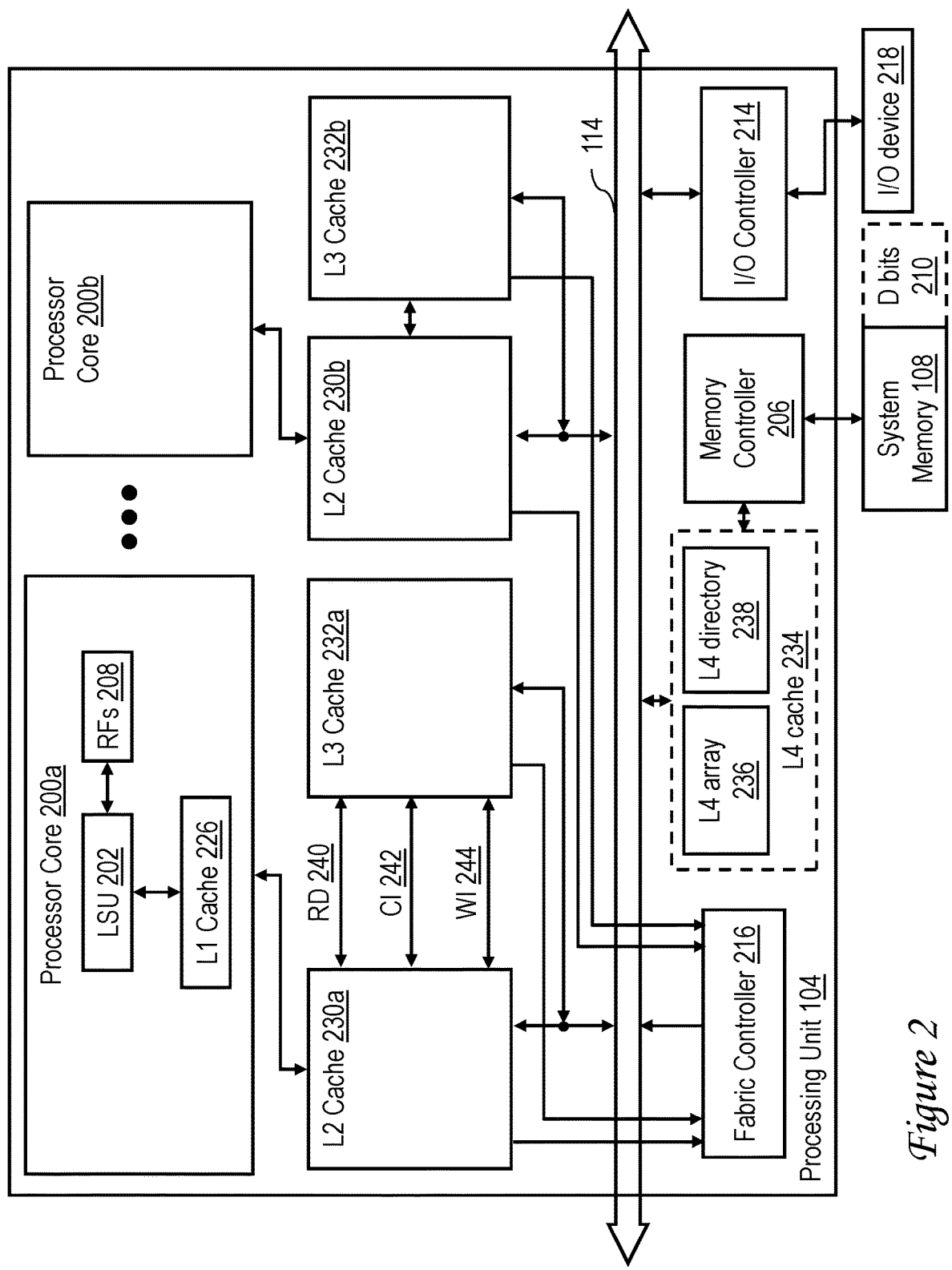
FIG. 2 is a more detailed block diagram of an exemplary processing unit in accordance with one embodiment.

Referring now to FIG. 2, there is depicted a more detailed block diagram of an exemplary processing unit 104 in accordance with one embodiment. In the depicted embodiment, each processing unit 104 is an integrated circuit including two or more processor cores 200a, 200b for processing instructions and data. In at least some embodiments, each processor core 200 is capable of independently executing multiple simultaneous hardware threads of execution.

As depicted, each processor core 200 includes one or more execution units, such as load-store unit (LSU) 202, for executing instructions. The instructions executed by LSU 202 include memory access instructions that request load or store access to a memory block in the distributed shared memory system or cause the generation of a request for load or store access to a memory block in the distributed shared memory system. Memory blocks obtained from the distributed shared memory system by load accesses are buffered in one or more register files (RFs) 208, and memory blocks updated by store accesses are written to the distributed shared memory system from the one or more register files 208.

The operation of each processor core 200 is supported by a multi-level memory hierarchy having at its lowest level a shared system memory 108 accessed via an integrated memory controller 206. As indicated by dashed line illustration, system memory 108 may optionally include a collection of D bits 210 including a plurality of bits each associated with a respective one of the memory blocks in system memory 108. A D bit is set (e.g., to 1) to indicate the associated memory block belongs to a dataset in which data is to be distributed among the various vertical cache hierarchies of data processing system 100 and is reset (e.g., to 0) otherwise. At its upper levels, the multi-level memory hierarchy includes one or more levels of cache memory. In the illustrative embodiment, the cache hierarchy includes a store-through level one (L1) cache 226 within and private to each processor core 200, a respective store-in level two (L2) cache 230a, 230b for each processor core 200a, 200b, a respective lookaside level three (L3) victim cache 232a, 232b for each processor core 200a, 200b populated with cache lines evicted from one or more of L2 caches 230, and optionally, a level four (L4) cache 234 that buffers data being written into and read from system memory 108. If present, L4 cache 234 includes a L4 array 236 for buffering cache lines of data and a L4 directory 238 of the contents of L4 array 236. In the illustrated embodiment, L4 cache 234 only caches copies of memory blocks corresponding to those stored in the associated system memory 108. In other embodiments, L4 cache 234 can alternatively be configured as a general last-level cache that caches copies of memory blocks corresponding to those stored in any of system memories 108. Those skilled in the art will appreciate from the following discussion those modifications to the disclosed embodiments that would be necessary or desirable if L4 cache 234 were instead configured to serve as a general last-level cache. As shown in detail for L2 cache 230a and L3 cache 232a, each L2-L3 cache interface includes a number of channels, including read (RD) channel 240, cast-in (CI) channel 242, and a write inject (WI) channel 244. Each of L2 caches 230 and L3 caches 232 is further coupled to local interconnect 114 and to a fabric controller 216 to facilitate participation of caches 230, 232 in the coherent data communication of data processing system 100.

Although the illustrated cache hierarchies includes three or four levels of cache, those skilled in the art will appreciate that alternative embodiments may include additional levels of on-chip or off-chip, private or shared, in-line or lookaside cache, which may be fully inclusive, partially inclusive, or non-inclusive of the contents of the upper levels of cache.

Each processing unit 104 further includes an integrated and distributed fabric controller 216 responsible for controlling the flow of operations on the interconnect fabric comprising local interconnect 114 and system interconnect 110 and for implementing the coherency communication required to implement the selected cache coherency protocol. Processing unit 104 further includes an integrated I/O (input/output) controller 214 supporting the attachment of one or more I/O devices 218.

In operation, when a hardware thread under execution by a processor core 200 includes a memory access (e.g., load or store) instruction requesting a specified memory access operation to be performed, LSU 202 executes the memory access instruction to determine the target address (e.g., an effective address) of the memory access request. After translation of the target address to a real address, L1 cache 226 is accessed utilizing the target real address. Assuming the indicated memory access cannot be satisfied solely by reference to L1 cache 226, LSU 202 then transmits the memory access request, which includes at least a transaction type (ttype) (e.g., load or store) and the target real address, to its affiliated L2 cache 230 for servicing. In servicing the memory access request, L2 cache 230 may access its associated L3 cache 232 and/or initiate a transaction including the memory access request on the interconnect fabric.

Figure 3:
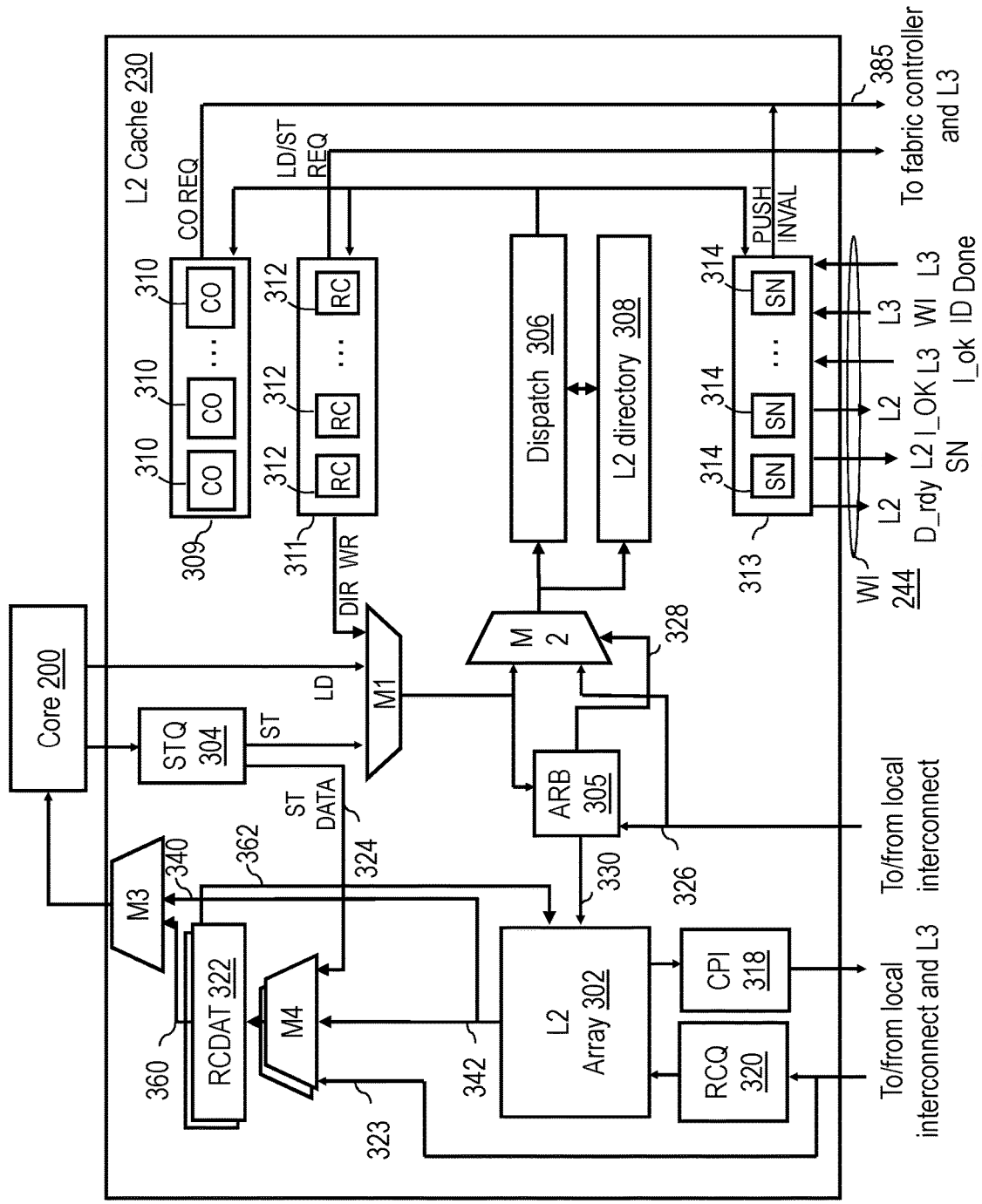
FIG. 3 is a more detailed block diagram of a level two (L2) cache in accordance with one embodiment.

With reference now to FIG. 3, there is illustrated a more detailed block diagram of an exemplary embodiment of a L2 cache 230 in accordance with one embodiment. As shown in FIG. 3, L2 cache 230 includes a L2 array 302 and a L2 directory 308 of the contents of L2 array 302. Although not explicitly illustrated, L2 array 302 preferably is implemented with a single read port and single write port to reduce the die area required to implement L2 array 302.

Assuming L2 array 302 and L2 directory 308 are set-associative as is conventional, memory locations in system memories 108 are mapped to particular congruence classes within L2 array 302 utilizing predetermined index bits within the system memory (real) addresses. The particular memory blocks stored within the cache lines of L2 array 302 are recorded in L2 directory 308, which contains one directory entry for each cache line. While not expressly depicted in FIG. 3, it will be understood by those skilled in the art that each directory entry in L2 directory 308 includes various fields, for example, a tag field that identifies the real address of the memory block held in the corresponding cache line of L2 array 302, a state field that indicate the coherency state of the cache line, a replacement order (e.g., LRU (Least Recently Used)) field indicating a replacement order for the cache line with respect to other cache lines in the same congruence class, and inclusivity bits indicating whether the memory block is held in the associated L1 cache 226.

L2 cache 230 additionally includes read-claim logic 311 including multiple (e.g., 16) read-claim (RC) machines 312 for independently and concurrently servicing load (LD) and store (ST) requests received from the affiliated processor core 200. As will be appreciated, the servicing of memory access requests by RC machines 312 may require the replacement or invalidation of memory blocks within L2 array 302. Accordingly, L2 cache 230 also includes castout logic 309 including multiple CO (castout) machines 310 that independently and concurrently manage the removal of memory blocks from L2 array 302 and the storage of those memory blocks in system memory 108 (i.e., writebacks) or a L3 cache 232 (i.e., L3 cast-ins).

In order to service remote memory access requests originating from processor cores 200 other than the affiliated processor core 200, L2 cache 230 also includes snoop logic 313 including multiple snoop machines 314. Snoop machines 314 can independently and concurrently service a remote memory access request "snooped" from local interconnect 114. As shown in FIG. 3, snoop logic 313 is coupled to the associated L3 cache 232 by WI channel 244, which is also illustrated in FIG. 2. WI channel 244 preferably includes (from the perspective of L2 cache 230) multiple signals lines suitable for transmitting at least a L2 data ready (L2 D_rdy) signal (which preferably includes a respective signal line for each SN machine 314 in L2 cache 230), a multi-bit L2 snoop machine ID (L2 SN ID) signal and a L2 inject OK (L2 I_OK) signal, and for receiving a L3 inject OK (L3 I_OK) signal, a multi-bit L3 write inject machine ID (L3 WI ID) signal, and a L3 Done signal (which preferably includes a respective signal line for each WI machine 314 in L3 cache 232).

L2 cache 230 further includes an arbiter 305 that controls multiplexers M1-M2 to order the processing of local memory access requests received from the affiliated processor core 200 and remote memory access requests snooped on local interconnect 114. Such memory access requests, including local load and store requests and remote load and store requests, are forwarded in accordance with the arbitration policy implemented by arbiter 305 to dispatch logic, such as a dispatch pipeline 306, which processes each memory access request with respect to L2 directory 308 and L2 array 302 and, if necessary and the required resource is available, dispatches the memory access request to the appropriate state machine for handling.

L2 cache 230 also includes an RC queue (RCQ) 320 and a castout push intervention (CPI) queue 318 that respectively buffer data being inserted into and removed from the L2 array 302. RCQ 320 includes a number of buffer entries that each individually correspond to a particular one of RC machines 312 such that each RC machine 312 that is dispatched retrieves data from only the designated buffer entry. Similarly, CPI queue 318 includes a number of buffer entries that each individually correspond to a particular one of the castout machines 310 and snoop machines 314, such that CO machines 310 and snoopers 314 direct transfer of data from L2 array 302 (e.g., to another L2 cache 230, to the associated L3 cache 232, or to a system memory 108) via only their respective designated CPI buffer entries.

Each RC machine 312 also has assigned to it a respective one of multiple RC data (RCDAT) buffers 322 for buffering a memory block read from L2 array 302 and/or received from local interconnect 114 via reload bus 323. The RCDAT buffer 322 assigned to each RC machine 312 is preferably constructed with connections and functionality corresponding to the memory access requests that may be serviced by the associated RC machine 312. RCDAT buffers 322 have an associated store data multiplexer M4 that selects data bytes from among its inputs for buffering in the RCDAT buffer 322 in response unillustrated select signals generated by arbiter 305.

In operation, a processor core 200 transmits store requests comprising a transaction type (ttype), target real address and store data to a store queue (STQ) 304. From STQ 304, the store data are transmitted to store data multiplexer M4 via data path 324, and the transaction type and target address are passed to multiplexer M1. Multiplexer M1 also receives as inputs processor load requests from processor core 200 and directory write requests from RC machines 312. In response to unillustrated select signals generated by arbiter 305, multiplexer M1 selects one of its input requests to forward to multiplexer M2, which additionally receives as an input a remote memory access request received from local interconnect 114 via remote request path 326. Arbiter 305 schedules local and remote memory access requests for processing and, based upon the scheduling, generates a sequence of select signals 328. In response to select signals 328 generated by arbiter 305, multiplexer M2 selects either the local memory access request received from multiplexer M1 or the remote memory access request snooped from local interconnect 114 as the next memory access request to be processed.

The memory access request selected for processing by arbiter 305 is placed by multiplexer M2 into dispatch pipeline 306. Dispatch pipeline 306 preferably is implemented as a fixed duration pipeline in which each of multiple possible overlapping requests is processed for a predetermined number of clock cycles (e.g., 4 cycles). During the first cycle of processing within dispatch pipeline 306, a directory read is performed utilizing the request address to determine if the request address hits or misses in L2 directory 308, and if the memory address hits, the coherency state of the target memory block. The directory information, which includes a hit/miss indication and the coherency state of the memory block, is returned by L2 directory 308 to dispatch pipeline 306 in a subsequent cycle. As will be appreciated, no action is generally taken within a L2 cache 230 in response to miss on a remote memory access request; such remote memory requests are accordingly discarded from dispatch pipeline 306. However, in the event of a hit or miss on a local memory access request or a hit on a remote memory access request, L2 cache 230 will service the memory access request, which for requests that cannot be serviced entirely within processing unit 104, may entail communication on local interconnect 114 via fabric controller 216.

At a predetermined time during processing of the memory access request within dispatch pipeline 306, arbiter 305 transmits the request address to L2 array 302 via address and control path 330 to initiate a cache read of the memory block specified by the request address. The memory block read from L2 array 302 is transmitted via data path 342 to multiplexer M4 for insertion into the appropriate RCDAT buffer 322. For processor load requests, the memory block is also transmitted to load data multiplexer M3 via data path 340 for forwarding to the affiliated processor core 200.

At the last cycle of the processing of a memory access request within dispatch pipeline 306, dispatch pipeline 306 makes a dispatch determination based upon a number of criteria, including (1) the presence of an address collision between the request address and a previous request address currently being processed by a castout machine 310, snoop machine 314 or RC machine 312, (2) the directory information, and (3) availability of an RC machine 312 or snoop machine 314 to process the memory access request. If dispatch pipeline 306 makes a dispatch determination that the memory access request is to be dispatched, the memory access request is dispatched from dispatch pipeline 306 to an RC machine 312 or a snoop machine 314. If the memory access request fails dispatch, the failure is signaled to the requestor (e.g., local or remote processor core 200) by a retry response. The requestor may subsequently retry the failed memory access request, if necessary.

While an RC machine 312 is processing a local memory access request, the RC machine 312 has a busy status and is not available to service another request. While an RC machine 312 has a busy status, the RC machine 312 may perform a directory write to update the relevant entry of L2 directory 308, if necessary. In addition, the RC machine 312 may perform a cache write to update the relevant cache line of L2 array 302. Directory writes and cache writes may be scheduled by arbiter 305 during any interval in which dispatch pipeline 306 is not already processing other requests according to the fixed scheduling of directory reads and cache reads. When all operations for the given request have been completed, the RC machine 312 returns to an unbusy state.

Associated with RC machines 312 is data handling circuitry, different portions of which are employed during the servicing of various types of local memory access requests. For example, for a local load request that hits in L2 directory 308, a copy of the target memory block is forwarded from L2 array 302 to the affiliated processor core 200 via data path 340 and load data multiplexer M3 and additionally forwarded to RCDAT buffer 322 via data path 342. The data forwarded to RCDAT buffer 322 via data path 342 and store data multiplexer M4 is then forwarded from RCDAT 322 to the affiliated processor core 200 via data path 360 and multiplexer M3. For a local store request, store data is received within RCDAT buffer 322 from STQ 304 via data path 324 and store data multiplexer M4, the store is merged with the memory block read into RCDAT buffer 322 from L2 array 302 via multiplexer M4, and the merged store data is then written from RCDAT buffer 322 into L2 array 302 via data path 362. In response to a local load miss or local store miss, the target memory block acquired through issuing a memory access operation on local interconnect 114 is loaded into L2 array 302 via reload bus 323, store data multiplexer M4, RCDAT buffer 322 (with store merge for a store miss) and data path 362.

Figure 4:
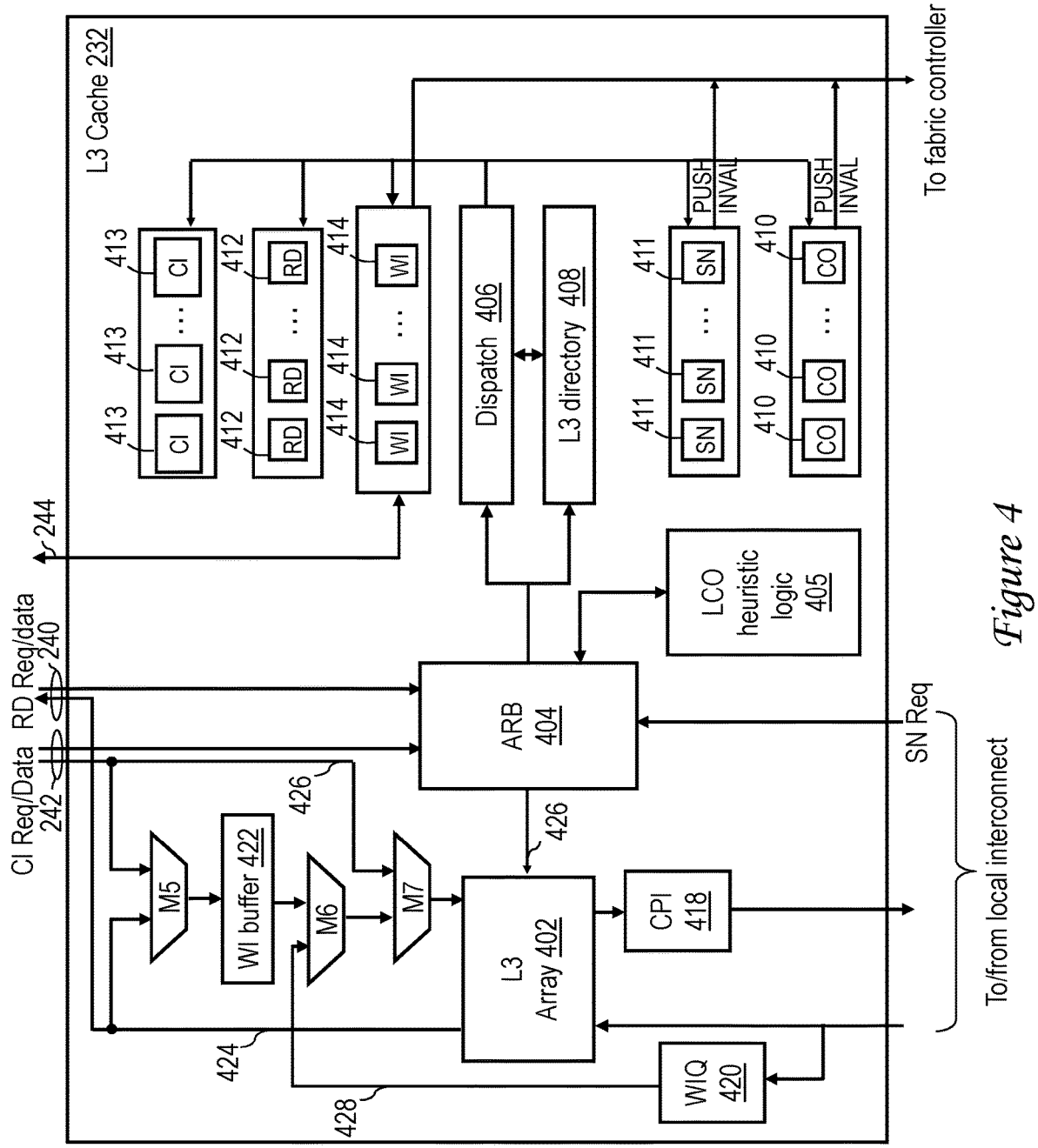
FIG. 4 is a more detailed block diagram of a level three (L3) cache in accordance with one embodiment.

Referring now to FIG. 4, there is depicted a more detailed view of a L3 cache 232 in accordance with one embodiment. As shown in FIG. 4, L3 cache 232 includes a L3 array 402 and a L3 directory 408 of the contents of L3 array 402. Assuming L3 array 402 and L3 directory 408 are set-associative as is conventional, memory locations in system memories 108 are mapped to particular congruence classes within L3 array 402 utilizing predetermined index bits within the system memory (real) addresses. The particular memory blocks stored within the cache lines of L3 array 402 are recorded in L3 directory 408, which contains one directory entry for each cache line. While not expressly depicted in FIG. 4, it will be understood by those skilled in the art that each directory entry in L3 directory 408 includes various fields, for example, a tag field that identifies the real address of the memory block held in the corresponding cache line of L3 array 402, a state field that indicate the coherency state of the cache line, and a replacement order (e.g., LRU) field indicating a replacement order for the cache line with respect to other cache lines in the same congruence class.

L3 cache 232 additionally includes various state machines to service various types of requests and to transfer data into and out of L3 array 402. For example, L3 cache 232 includes multiple (e.g., 16) read (RD) machines 412 for independently and concurrently servicing read (RD) requests received from the affiliated L2 cache 230 via RD channel 240. L3 cache 232 also includes multiple snoop (SN) machines 411 for handling remote memory access requests snooped from local interconnect 114 that originate from L2 caches 230 supporting remote processor cores 200. As is known in the art, the servicing of snooped requests may include, for example, invalidating cache lines in L3 directory 408 and/or sourcing cache lines of data from L3 array 402 by cache-to-cache intervention. L3 cache 232 additionally includes multiple cast-in (CI) machines 413 for servicing cast-in (CI) requests received from the affiliated L2 cache 230 via CI channel 242. As will be appreciated, the servicing of cast-in requests by CI machines 413 by storing in L3 array 402 cache lines castout from the associated L2 cache 230 may require the replacement of memory blocks in L3 array 402. Accordingly, L3 cache 232 also includes castout (CO) machines 410 that manage the removal of memory blocks from L3 array 402 and, if necessary, the writeback of those memory blocks to system memory 108. Data removed from L3 cache 232 by CO machines 410 and SN machines 411 is buffered in a castout push intervention (CPI) queue 418 prior to transmission to local interconnect 114. In addition, L3 cache 232 includes a plurality of write inject (WI) machines 414 that service requests received on local interconnect 114 to inject partial or full cache lines of data into the L3 array 402 of L3 cache 232. Write injection data received in conjunction with write injection requests is temporarily held in a write inject queue 420 (WIQ), which preferably includes one or more entries each having the width of a full cache line (e.g., 128 bytes). In a preferred embodiment, write injection requests are serviced exclusively by L3 cache 232 to avoid introducing additional complexity into higher level caches having lower access latency requirements, such as L2 cache 230. One or more of SN machines 411, CI machines 413, and WI machines 414 additionally handle lateral castout (LCO) requests of other L3 caches 232 snooped from local interconnect 114 and, in so doing, install cache lines of data received in conjunction with the LCO requests into L3 array 402. Again, the servicing of LCO requests by storing in L3 array 402 cache lines castout from other L3 caches 232 may require the replacement of cache lines residing in L3 array 402.

L3 cache 230 further includes an arbiter 404 that orders the processing of CI requests and RD requests received from the associated L2 cache 230, as well as remote memory access requests, LCO requests, and write injection requests snooped from local interconnect 114. These memory access requests are forwarded in accordance with the arbitration policy implemented by arbiter 404 to dispatch logic, such as a dispatch pipeline 406, which processes each memory access request with respect to L3 directory 408 and L3 array 402 and, if necessary, dispatches the memory access requests to the appropriate state machines 411, 412, 413 or 414 for processing. If necessary, at a predetermined time during processing of the memory access request within dispatch pipeline 406, arbiter 404 transmits the request's target real address to L3 array 402 via address and control path 426 to initiate a cache read of the memory block specified by the request's target real address.

Arbiter 404 is further coupled to lateral castout (LCO) heuristic logic 405, which indicates, based on a variety of factors such as workload characteristics, hit rates, etc., whether victim cache lines to be evicted from L3 array 402 are to be castout vertically to lower level storage (e.g., L4 cache 234 or system memory 108) or castout laterally to another L3 cache 232. As discussed further herein, arbiter 404 generally determines whether to castout a cache line vertically or laterally based on the indication provided by LCO heuristic logic 405. However, for the subset of cache lines marked with a set distribute (D) field in L3 directory 408, arbiter 404 preferably does not determine whether to castout vertically or laterally based solely on LCO heuristic logic 405. For such cache lines, arbiter 404 causes L3 cache 232 to instead distribute the cache lines among vertical cache hierarchies, for example, in accordance with the process described below with reference to FIG. 16.

FIG. 4 additionally illustrates data handling logic and data paths utilized to service various types of memory access requests in the illustrated embodiment. In the illustrated embodiment, the data handling logic includes multiplexers M5, M6 and M7 and a write inject buffer 422. The data paths include a data path 424, which can forward data read from L3 array 402, for example, in response to a RD request or a WI request, to multiplexer M5 and RD channel 240. L3 cache 232 additionally includes a data path 428, which can forward CI data received from the associated L2 cache 230 to multiplexers M5 and M7. L3 further includes data path 428, which can forward WI data held in WIQ 420 to multiplexer M6. Unillustrated select signals generated by arbiter 404 select which data, if any, is written into L3 array 402 by multiplexer M7.

In data processing systems such as data processing system 100, it is common for I/O devices, such as I/O device 218, to issue requests on the system fabric in order to write data into the memory hierarchy. When data from an I/O device is to be written directly into a cache memory rather than into a system memory 108, such a request is referred to as a "cache injection" request. If the data from the I/O device is to be written into system memory 108 (or its associated memory cache (e.g., L4 cache 234)), the request is referred to as a direct memory access (DMA) write request. In general, it is preferred if the I/O data is written into the cache hierarchy rather than into system memory 108 or L4 cache 234 due to the lower access latency of cache memory.

In some cases, however, the dataset to be written into memory by an I/O device is large compared to the storage capacity of an individual cache, and the volume of cache injection requests associated with writing such a large dataset may overwhelm the resources (e.g., WI machines 414 and cache lines in L3 array 402) in any one cache required to handle the cache inject requests. Consequently, the present application recognizes that it would be useful and desirable to enable the data of cache inject requests to be selectively distributed among multiple vertical cache hierarchies when first written into the memory system of a data processing system.

In addition, the present application recognizes that because a cache injection request is, by definition, a request to update a cache line, a cache injection request can only be successful if the cache line targeted by the cache injection request is present in a cache in a coherence state signifying that the cache holding the cache line has write authority for the cache line (i.e., is the HPC, as discussed below). Accordingly, the present disclosure provides an instruction that designates a vertical cache hierarchy that will receive an injected cache line, that enables a cache line held in the designated vertical cache hierarchy to be initialized to an appropriate coherence state that enables a cache injection request to succeed, and that additionally designates the injected cache line as belonging to a dataset that should be distributed among multiple vertical cache hierarchies.

The present disclosure additionally recognizes that the dataset written into the memory system by cache injection is often consumed by a single processor core 200 or cores 200 of a single processing unit 104. As the processor core(s) 200 consume and possibly update the dataset, the dataset is centralized in the vertical cache hierarchy or hierarchies of small number of processor cores 200. As the cache lines of the dataset begin to age, the cache lines will be castout of higher levels of the memory hierarchy to lower levels of the memory hierarchy. Again, the present disclosure again recognizes that, as this castout process proceeds, it would be useful and desirable for the cache lines in the dataset to be distributed among multiple cache hierarchies rather than concentrated in one or a few cache hierarchies.

Figures 5, 6A, 6B, 7A, 7B, 8, 9:
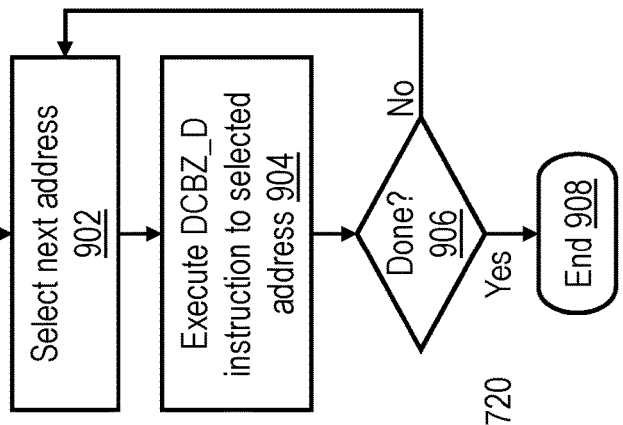
FIG. 5 illustrates an exemplary cache directory entry in accordance with one embodiment.
FIGS. 6A-6B respectively depict an exemplary direct memory access (DMA) write request and an exemplary cache injection request in accordance with one embodiment.
FIGS. 7A-7B respectively illustrate an exemplary castout (CO) request and an exemplary lateral castout (LCO) request in accordance with one embodiment.
FIG. 8 depicts an exemplary data cache block zero (DCBZ) distribute instruction in accordance with one embodiment.
FIG. 9 is a high-level logical flowchart of an exemplary method by which a region of memory for holding injected data is initialized in accordance with one embodiment.

In the embodiments disclosed herein, the distribution of the cache lines comprising a dataset of injected data is supported through the implementation of a distribute (D) field that is stored in association with granules of the dataset at various levels of the memory hierarchy and communicated in conjunction with requests on the system fabric that target the dataset. A D field is set (e.g., to 1) to indicate the associated data belongs to a dataset in which data is to be distributed among the various vertical cache hierarchies of data processing system 100 and is reset (e.g., to 0) otherwise. For example, referring again briefly to FIG. 1, system memory 108 may optionally provide storage for D bits 210, which may be implemented, for example, as a respective $65^{th}$ bit appended to each 64-bit double word of data in system memory 108. Similarly, as shown in FIG. 5, a directory entry 500 of a cache memory (e.g., in L2 directory 308, L3 directory 408, or L4 directory 238) may include, in addition to possibly conventional valid field 502, address tag field 504, and coherence state field 506, a D field 508 indicating whether or not the associated cache line of data is a member of dataset in which the data should be distributed among the various vertical cache hierarchies of data processing system 100. In the following discussion, it will be assumed that each directory entry of each L2 directory 308 and L3 directory 408 contains a D field 508 and that the entries of L4 directories 238, if present, may optionally include a D field 508, but will contain a D field 508 if system memory 108 stores optional D bits 210.

Referring now to FIGS. 6A-6B, there are depicted an exemplary direct memory access (DMA) write request 600 and an exemplary cache injection request 610 in accordance with one embodiment. Requests 600 and 610 may be issued on the system fabric of data processing system 100 by I/O controller 214, for example, in response to receipt of corresponding requests from I/O device 218. As indicated, requests 600 and 610 are similarly structured and include, for example, a valid field 602 or 612 indicating that the contents of the request are valid, a transaction type (ttype)

field 604 or 614 identifying the type of the request (i.e., DMA write or cache injection), and an address field 608 or 618 specifying the target real address of the request. In this example, each of requests 600, 610 additionally includes a distribute (D) field 606 or 616 indicating whether or not the associated data granule (communicated in a separate associated data tenure on the system fabric) belongs to a dataset that should be distributed among the various vertical cache hierarchies of data processing system 100. As above, the D field is set (e.g., to 1) to indicate the data granule should be distributed and is reset (e.g., to 0) otherwise. In embodiments in which D bits 210 are omitted from system memory 108, D field 606 in DMA write request 600 can also be omitted.

With reference now to FIGS. 7A-7B, an exemplary L2 castout (CO) request 700 and an exemplary L3 lateral castout (LCO) request 720 in accordance with one embodiment are illustrated. CO request 700 may be issued, for example, from a higher level cache to a lower level cache or system memory 108 in order to free a cache line in the cache. LCO request 720 may be issued, for example, on the system fabric of data processing system 100 by a source L3 cache 232 in order to free a cache line in the L3 array 402 of the source L3 cache 232 or in order to distribute, to another L3 cache 232, a victim cache line the source L3 cache 232 received as a castout from its associated L2 cache 230. As indicated, requests 700 and 720 are similarly structured and include, for example, a valid field 702 or 722 indicating that the contents of the request are valid, a transaction type (ttype) field 704 or 724 identifying the type of the request, an address field 708 or 728 specifying the target real address of the castout cache line, and a state field 710 or 730 indicating a coherence state of the castout cache line. In addition, each of requests 700, 720 includes a distribute (D) field 706 or 726 indicating whether or not the associated data granule (communicated in a separate associated data tenure) belongs to a dataset that should be distributed among the various vertical cache hierarchies of data processing system 100. As above, the D field is set (e.g., to 1) to indicate the data granule should be distributed and is reset (e.g., to 0) otherwise. Finally, LCO request 720 includes a target ID field 732 that specifies the target L3 cache 232 that is to accept the castout cache line of data.

Referring now to FIG. 8, an exemplary data cache block zero distribute (DCBZ_D) instruction in accordance with one embodiment is depicted. DCBZ_D instruction 800 may be executed by an execution unit (e.g., LSU 202) of any processor core 200 to establish a specified cache line within a cache memory in the associated vertical cache hierarchy of that processor core 200, zero the data of the cache line, set its associated state field 506 to a coherence state indicating write authority (i.e., an HPC state), and set its D field 508 to a desired state. As shown, in the depicted example, DCBZ_D instruction 800 includes an opcode field 804 identifying the type of the instruction (i.e., a DCBZ instruction) and operand fields 808 and 810 utilized to specify the operand(s) utilized to calculate the target effective address of the memory location to be zeroed. In addition, DCBZ_D instruction 800 includes a distribute (D) field 806 that is set (e.g., to 1) to indicate the data granule to be zeroed belongs to a dataset that should be distributed among the various vertical cache hierarchies of data processing system 100 and is reset (e.g., to 0) otherwise.

With reference now to FIG. 9, there is illustrated a high-level logical flowchart of an exemplary method by which a region of memory for holding injected data is initialized in accordance with one embodiment. The illustrated process can be performed, for example, through the execution of a sequence of DCBZ_D instructions 800 by a hardware thread of one of processor cores 200. It should be appreciated that the illustrated process, while optional, increases the probability that subsequent cache injection requests targeting addresses in the initialized region of memory will be successful.

The process of FIG. 9 begins at block 900 and then proceeds to block 902, which illustrates the processor core 200 selecting a next address of a memory location to be zeroed. The selection shown in block 902 may include advancing one or more pointers or other variable values to appropriately set up the value(s) of the operand field(s) 808 and/or 810 of a DCBZ_D instruction 800. At block 904, the processor core 200 executes the DCBZ_D instruction 800, which causes the processor core 200 to calculate the target effective address of a memory location to be zeroed based on operand fields 808, 810, translate the target effective address to obtain a target real address, and issue a DCBZ request to the associated L2 cache 230 with an indication of the value in D field 806. In response to receipt of the DCBZ request from the processor core 200, the associated L2 cache 230 obtains, if necessary, write authority for the target real address (e.g., by issuing one or more requests on the system fabric of data processing system 100), allocates and zeros a cache line associated with the target real address in L2 array 302 (evicting an existing cache line if necessary), and establishes a corresponding entry in L2 directory 308 with a D field 508 that is set or reset in accordance with indication of the value in D field 806 of the DCBZ_D instruction 800.

At block 906, the hardware thread of the processor core 200 executes one or more instructions to determine whether or not initialization of the region of memory is complete. If not, the process returns to block 902, which has been described. If, however, a determination is made at block 906 that all addresses in the region of memory to be initialized have been allocated in the associated L2 cache 230 and zeroed, the process of FIG. 9 ends at block 908.

Upon reference to FIG. 9, those skilled in the art will appreciate that a sequence of DCBZ_D instructions 800 can be executed to initialize a collection of cache lines and prepare those cache lines as targets of subsequent cache injection requests. The target cache lines are initialized to a coherence state that designates the vertical cache hierarchy or hierarchies that will receive the various injected cache lines and that enables the cache injection requests to succeed. In addition, assuming the D fields 508 of the DCBZ_D instructions 800 in the sequence are all set, the cache lines are all marked, via set D fields 806, as belonging to a dataset that should be distributed among multiple vertical cache hierarchies rather than castout to system memories 108. Given the small size of L2 array 302 and L3 array 402 relative to many I/O datasets, the marking of the cache lines as belonging to the dataset and can significantly improve performance by retaining the marked cache lines in low-latency cache rather than allowing them to be castout to high-latency system memories 108. For example, assuming the dataset is 16 MB in size, the capacity of a L2 array 302 is 128 KB, and the capacity of a L3 array 402 is 1 MB, initializing the cache lines in the dataset will overrun the capacity of a given vertical cache hierarchy, resulting in castouts. The marking of the cache lines as belonging to the dataset (by the set D fields 806) causes the cache lines to be distributed among the various vertical cache hierarchies as they are castout, as described in detail below with reference to FIGS. 15-16.

Referring now to FIGS. 10-13, there is illustrated a high level logical flowchart of an exemplary method of injecting at least a partial cache line of write inject data into a lower level cache (e.g., a L3 cache 232) in accordance with one embodiment. The process begins at block 1000 of FIG. 10 and then proceeds to block 1002, which illustrates a determination of whether or not a cache injection request 610 has been received on local interconnect 114 by a pair of associated L2 and L3 caches 230, 232. As noted above, the cache injection request can be issued, for example, by an I/O controller 214 on behalf of an attached I/O device 218 in order to write a dataset of the I/O device 218 into the memory hierarchy of data processing system 100. If no cache injection request is received at block 1002, the process continues to iterate at block 1002. However, in response to a receipt of a cache injection request at block 1002, the process proceeds from block 1002 to blocks 1004 and 1006, which respectively illustrate determinations of whether or not the L3 cache 232 or the L2 cache 230 is the Highest Point of Coherency (HPC) for the target real address of the write injection request.

As utilized herein, a Lowest Point of Coherency (LPC) is defined herein as a memory device or I/O device that serves as the repository for a memory block. In the absence of an HPC for the memory block, the LPC holds the true image of the memory block and has authority to grant or deny requests to generate an additional cached copy of the memory block. For a typical request in the data processing system embodiment of FIGS. 1-4, the LPC will be the memory controller 206 for the system memory 108 holding the referenced memory block. An HPC is defined herein as a unique device (throughout all of data processing system 100) that caches a true image of the memory block (which may or may not be consistent with the corresponding memory block at the LPC) and that has the authority to grant or deny a request to modify the memory block. Thus, at most one of the L2 cache 230 and L3 cache 232 is the HPC for the memory block associated with a given target real address. Descriptively, the HPC may also provide a copy of the memory block to a requesting device. Thus, for a typical memory access request in the data processing system embodiment of FIGS. 1-4, the HPC, if any, will be a L2 cache 230 or L3 cache 232. Although other indicators may be utilized to designate an HPC for a memory block, in a preferred embodiment, the HPC, if any, for a memory block is designated by selected cache coherence state(s) within the directory of a L2 cache 230 or L3 cache 232.

In response to a determination at block 1004 that the L3 cache 232 is the HPC for the target real address of the cache injection request, the process proceeds through page connector A to FIG. 11, which is described below. In response to a determination that the L2 cache 230 is the HPC for that target real address of the cache injection request, the process passes through page connector B to FIG. 12, which is described below. If, however, no L2 cache 230 or L3 cache 232 is the HPC for the target real address of the cache injection request, then the cache injection request preferably degrades to a DMA write request and is serviced by the relevant memory controller 206 or its associated L4 cache 234 (if present), as shown at blocks 1008-1020. In this case, any L2 cache 230 or L3 cache 232 that holds a valid shared copy of the target cache line of the cache injection request or is in the process of invalidating a valid copy of the target cache line (block 1008) responds to the cache injection request by beginning to push any modified data associated with the target real address, if present, to system memory 108 and/or invalidating its copy of the target cache line (block 1010). In addition, the L2 cache 230 or L3 cache 232 provides a Retry coherence response on the system fabric indicating that the cache injection request cannot complete successfully (block 1014). Following block 1014, the process of FIG. 10 returns to block 1002, which has been described. It should be appreciated that the I/O controller 214 may reissue the cache injection request 610 multiple times on the system fabric of data processing system 100 until any modified data associated with the target real address of the cache injection request has been written back to system memory 108 and all cache copies of the target cache line have been invalidated, such that a negative determination is made at block 1008.

Figure 10:
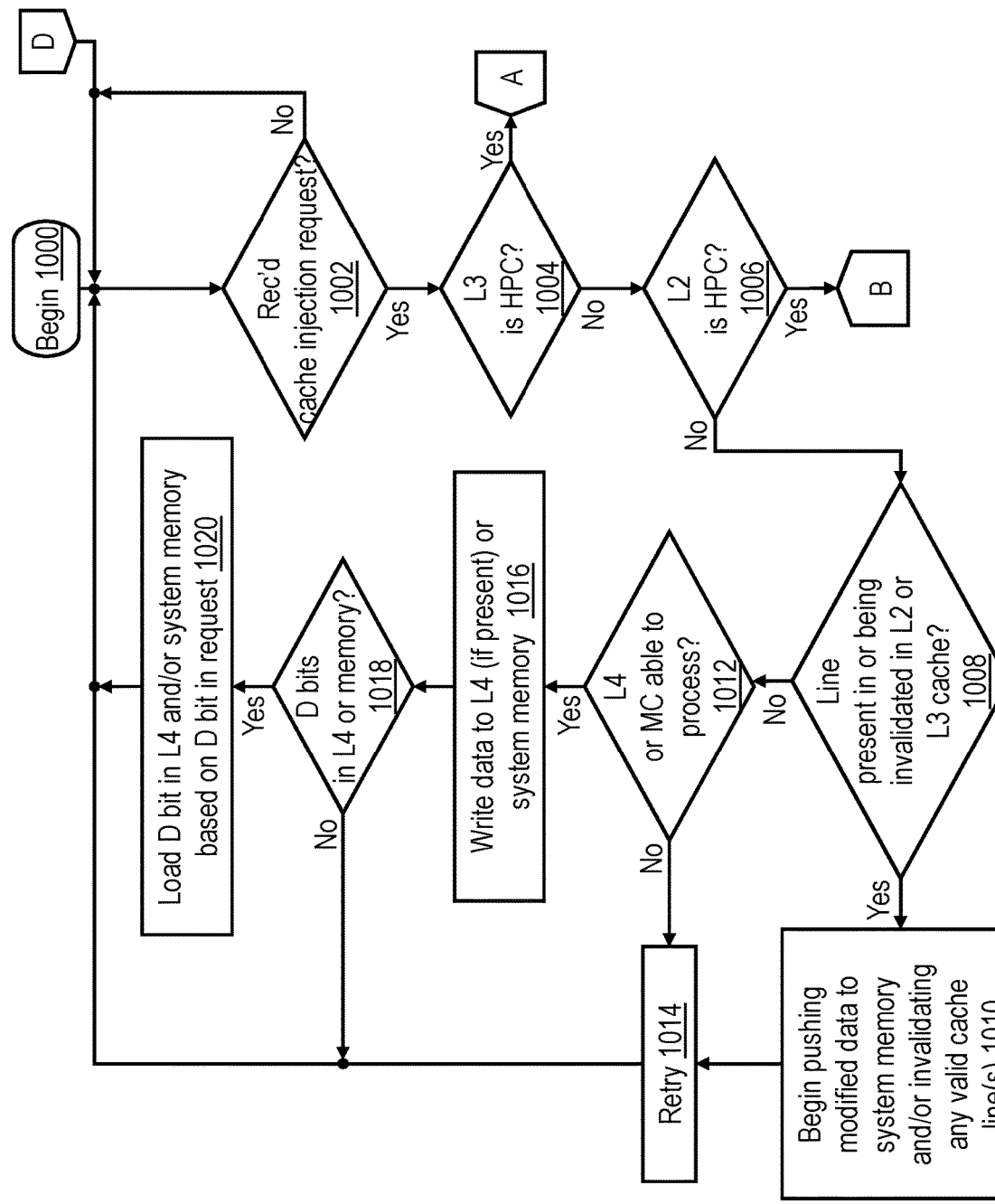
FIGS. 10-13 together form a high-level logical flowchart of an exemplary method of injecting at least a partial cache line of data into a lower level cache (e.g., L3 cache) in accordance with one embodiment.

Based on a negative determination at block 1008, the process of FIG. 10 proceeds to block 1012, which illustrates an additional determination of whether the relevant memory controller 206 assigned the target real address of the cache injection request 610 or its associated L4 cache 234 (if present) is able to process the cache injection request 610. If not, the memory controller 206 and/or associated L4 cache 234 provides a Retry coherence response on the system fabric that prevents the cache injection request 610 from completing successfully (block 1014), and the process returns to block 1002. If, however, an affirmative determination is made at block 1012, the cache injection request 610 is serviced by the relevant L4 cache 234 (if present) or the relevant memory controller 206 by writing the data tenure associated with the cache injection request 610 into L4 array 236 or into system memory 108 (block 1016). As indicated by blocks 1018-1020, if D bits 210 are implemented in system memory 108 or a D field 508 is implemented in L4 directory 238, L4 cache 234 and/or memory controller 206 additionally loads the relevant D bit 210 and/or D field 508 with the value of D field 616 in the cache injection request 610. Thereafter, the process of FIG. 10 returns to block 1002.

Figure 11:
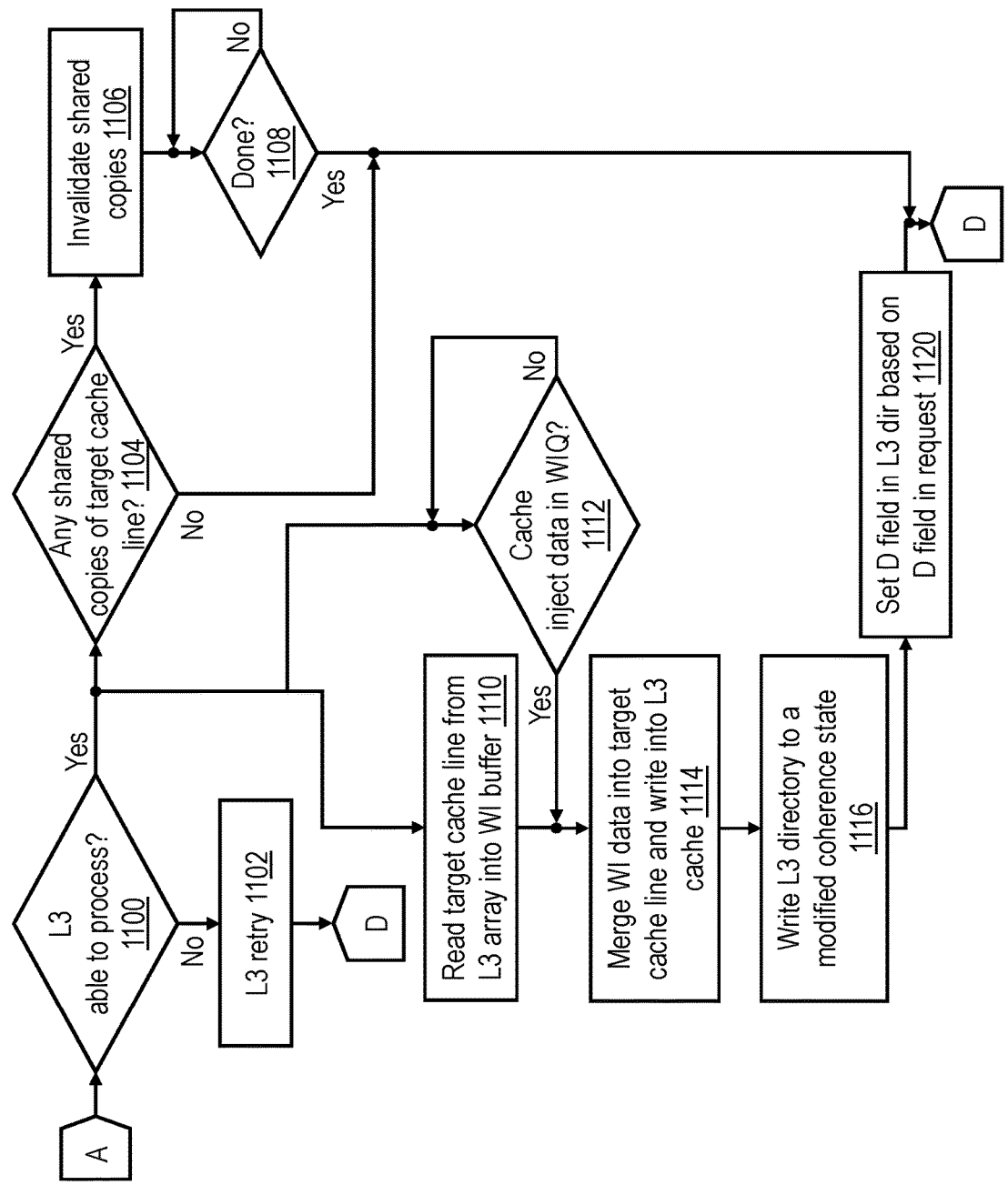

Reference is now made to FIG. 11, which details an embodiment of a process in the case in which a L3 cache 232 was found to be the HPC of the target real address of a cache injection request 610. The process of FIG. 11 begins at page connector A and then passes to block 1100, which illustrates the L3 cache 232, which is the HPC for the target real address of the cache injection request 610, determining whether it is currently able to process the cache injection request 610. For example, the determination shown at block 1100 may include a determination of whether or not all resources required to service the cache injection request 610, including a WI machine 414, are currently available for allocation to the cache injection request 610. In response to a determination that the HPC L3 cache 232 is not currently able to process the cache injection request 610, the L3 cache 232 provides a Retry coherence response to the cache injection request 610 on the interconnect fabric (block 1102), requesting that the source of the cache injection request 610 (e.g., I/O controller 214) re-issue the cache injection request again at a later time. Thereafter, the process returns through page connector D to block 1002 of FIG. 10.

Returning to block 1100, in response to a determination that L3 cache 232 is presently able to process the cache injection request 610, the process of FIG. 11 bifurcates and proceeds to blocks 1104-1108 and 1110-1116 in parallel. At block 1104, L3 cache 232 determines whether or not there may be any shared copies of the target cache line within data processing system 100, for example, by reference to the coherence state of the target real address in its directory 408 and/or an individual or systemwide coherence response to the cache injection request 610. If not, the process simply rejoins the other branch of the process. If, however, the L3 cache 232 determines that there may be at least one shared copy of the target cache line within data processing system 100, L3 cache 232 invalidates any shared copy or copies of the target cache line by issuing one or more kill requests on local interconnect 114 (block 1106). Once the other copy or copies of the target cache line have been invalidated (block 1108), the process rejoins the other branch of the process.

Turning now to the other branch of the process shown in FIG. 11, arbiter 404 directs L3 array 402 via control path 426 to read out the target cache line of the cache injection request (block 1110). The target cache line is forwarded via data path 424 and multiplexer M5 to WI buffer 422. L3 cache 232 contemporaneously determines at block 1112 whether or not the at least partial cache line of write inject data of the cache injection request has been received within WIQ 420 in a data tenure on local interconnect 114. In various embodiments, the cache inject data may be received from the source of the cache injection request contemporaneously with or at a different time than the write injection request. If not, the process waits at block 1112 until the cache inject data is received. Once the target cache line has been read into WI buffer 422 at block 1110 and the cache inject data has been received within WIQ 420 at block 1112, arbiter 404 controls the selection of bytes of data by multiplexer M6 to merge the partial or full cache line of write inject data into the target cache line (block 1114). The updated target cache line is then written into L3 array 402 via multiplexer M7. Based on the update to the target cache line, a WI machine 414 also writes the corresponding entry in L3 directory 408 to the appropriate modified coherence state, which preferably indicates that the L3 cache 232 remains the HPC of the target memory block (block 1116). In addition, the WI machine 414 updates the D field 508 in the entry in L3 directory 408 in accordance with the D field 616 of the cache injection request 610 (block 1120). Following the completion of both branches of the process shown in FIG. 11, servicing of the cache injection request 610 is complete, the WI machine 414 allocated to the cache injection request 610 is released to return to the unbusy state, and the process returns via page connector D to block 1002 of FIG. 10.

Figure 12:
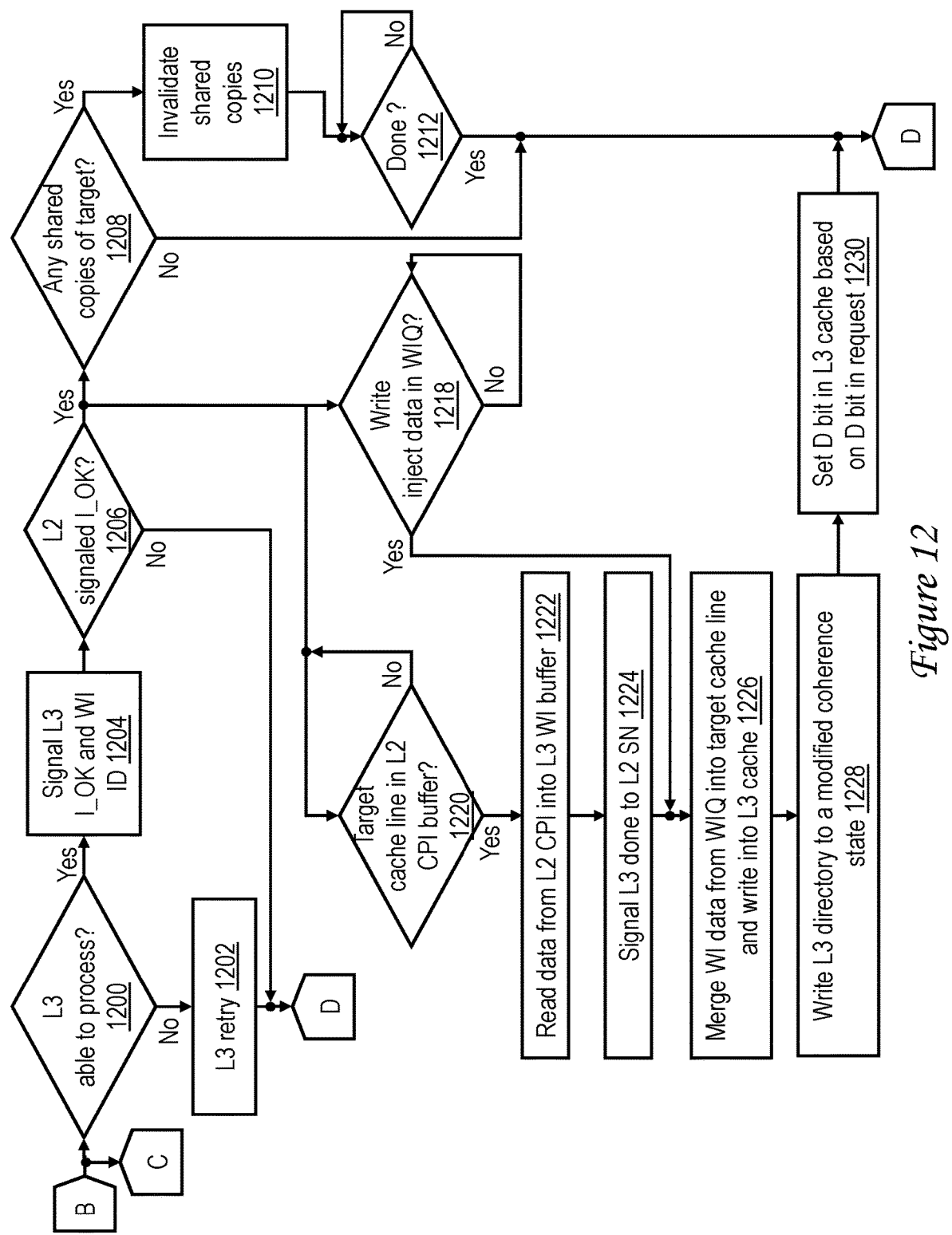
Figure 13:
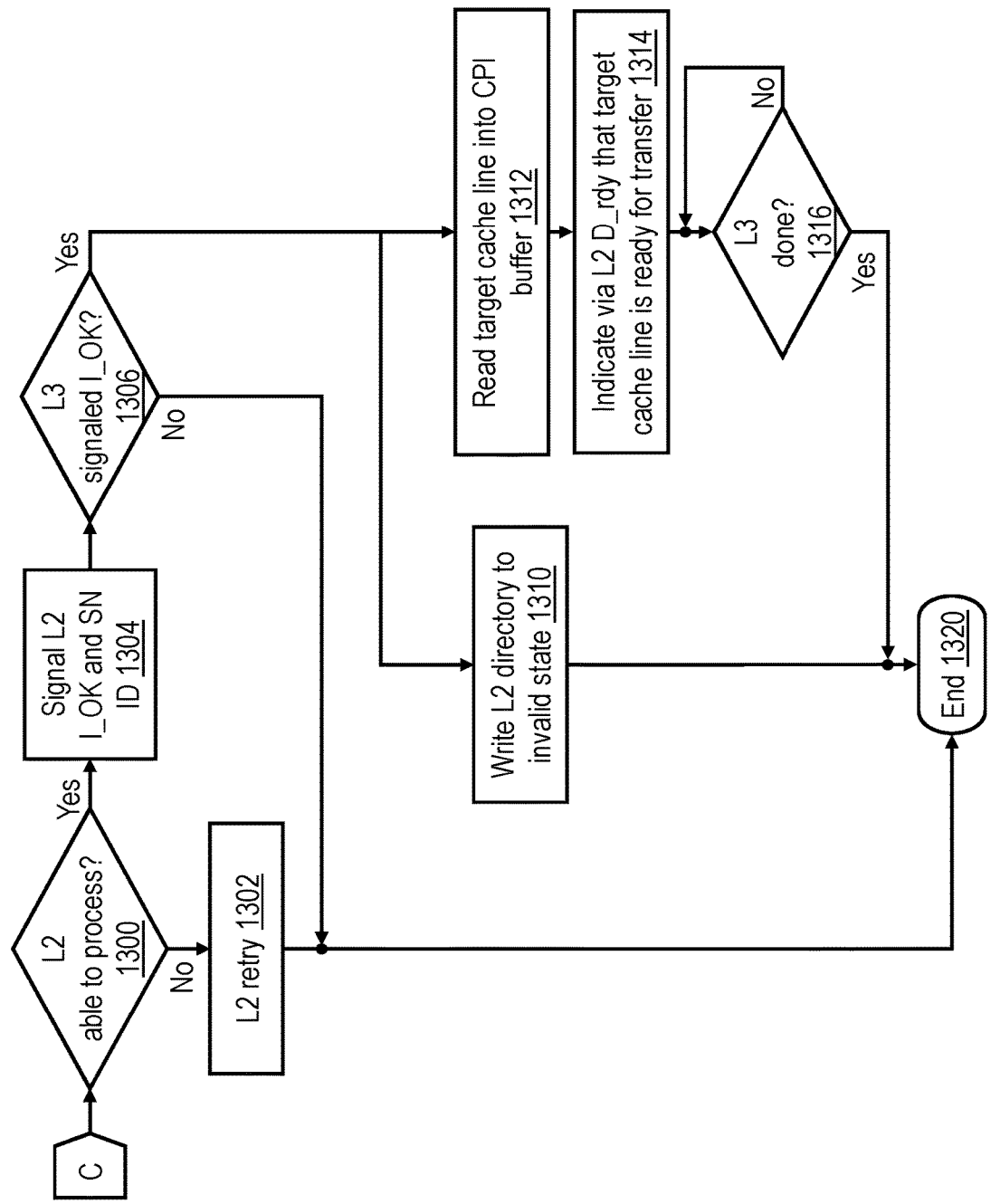

With reference now to FIGS. 12-13, an example of the processing performed in the case that the L2 cache 230 is the HPC for the target cache line of the cache injection request 610 is described. The processing begins at page connector B and then bifurcates and proceeds in parallel to the process given in FIG. 12, which illustrates the processing performed by L3 cache 232, and through page connector C to the process given in FIG. 13, which depicts the processing performed by L2 cache 230.

Referring first to FIG. 12, the process proceeds from page connector B to block 1200, which illustrates L3 cache 232 determining whether it is currently able to process the cache injection request 610. For example, the determination shown at block 1200 may include a determination of whether or not all resources required to service the cache injection request 610, including a WI machine 414, are currently available for allocation to the cache injection request 610. In response to a determination at block 1200 that the L3 cache 232 is not currently able to process the cache injection request 610, the L3 cache 232 provides a Retry coherence response to the cache injection request 610 (block 1202), requesting that the source of the cache injection request 610 re-issue another cache injection request at a later time. Thereafter, the process returns through page connector D to block 1002 of FIG. 10.

Returning to block 1200, in response to a determination that L3 cache 232 is presently able to process the cache injection request 610, L3 cache 232 allocates the resources necessary to service the cache injection request 610, including a WI machine 414. The allocated WI machine 414 then utilizes WI channel 244 to signal the associated L2 cache 230 that the L3 cache 232 can service the cache injection request 610 by asserting L3 I_OK and by providing L2 cache 230 the WI ID of the allocated WI machine 414 (block 1204). The WI ID informs L2 cache 230 which of the L3 Done signal lines should be monitored to determine when a L2 SN machine 314 allocated to the cache injection request 610 can be released. At block 1206, the allocated WI machine 414 then determines whether or not L2 cache 230 has indicated that it can also service the cache injection request 610 by asserting L2 I_OK. If not, processing of the cache injection request 610 by L3 cache 232 ends, the WI machine 414 allocated to the cache injection request 610 is released to return to an unbusy state, and the process returns to block 1002 of FIG. 10 via page connector D.

In response to an affirmative determination at block 1206, meaning that both the L2 cache 230 and L3 cache 232 are able to process the cache injection request 610, the process again bifurcates and proceeds to blocks 1208-1212 and 1218-1228 in parallel. At block 1208, L3 cache 232 determines whether or not there may be any shared copies of the target cache line within data processing system 100, for example, by reference to the coherence state information provided by the associated L2 cache 230 and/or an individual or systemwide coherence response to the cache injection request 610. In response to a determination at block 1208 that no shared copies of the target cache line are cached in data processing system 100, the process simply rejoins the other branch of the process. If, however, the L3 cache 232 determines that there may be at least one shared copy of the target cache line cached within data processing system 100, WI machine 414 of L3 cache 232 invalidates the shared copy or copies of the target cache line by issuing one or more kill requests on local interconnect 114 (block 1210). Once the other copy or copies of the target cache line have been invalidated (block 1212), the process rejoins the other branch of the process.

Turning now to block 1218, L3 cache 232 determines whether or not the partial or full cache line of cache inject data of the cache injection request 610 has been received from local interconnect 114 within WIQ 420. As noted above, in various embodiments, the write inject data may be received from the source of the cache injection request 610 contemporaneously with or at a different time than the cache injection request 610. If not, the process waits at block 1218 until the write inject data is received. Contemporaneously, the L2 cache 230 and L3 cache 232 collaborate to transfer the target cache line of data from the L2 cache 230 to the L3 cache 232. For example, in the illustrated embodiment, L3 cache 232 determines at block 1220 whether or not L2 cache 230 has indicated by assertion of one of the L2 D_rdy signals of WI channel 244 that the target cache line has been read out of L2 array 302 into L2 CPI buffer 318 (the relevant one of the L2 D_rdy signals is identified by the SN ID provided by the L2 cache 230 at block 1304, as described below). If not, the process iterates at block 1220. In response to L2 cache 230 indicating that the target cache line has been read into L2 CPI buffer 318, the SN machine 314 of L2 cache 230 allocated to service the cache injection request 610 causes the target cache line to be transferred from L2 CPI buffer 318 into WI buffer 422 of L3 cache 232 via CI channel 242, data path 426, and multiplexer M5 (block 1222). In response to receipt of the target cache line in WI buffer 422, the WI machine 414 allocated to service the cache injection request 610 asserts the appropriate one of the L3 Done signals via WI channel 244 (block 1224), releasing the SN machine 314 allocated to service the cache injection request 610 to return to a unbusy state in which it is available for allocation to a subsequent request snooped on local interconnect 114.

Following completion of the process shown at blocks 1218 and 1224, arbiter 404 controls the selection of bytes of data by multiplexer M6 to merge the partial or full cache line of write inject data into the target cache line (block 1226). The updated target cache line is then written into L3 array 402 via multiplexer M7. Based on the update to the target cache line, arbiter 404 also writes the corresponding entry in L3 directory 408 to the appropriate modified coherence state, which preferably indicates that the L3 cache 232 is the HPC of the target memory block (block 1228). In addition, arbiter 404 updates the D field 508 in the entry in L3 directory 408 in accordance with the D field 616 of the cache injection request 610 (block 1230). Following the completion of the processing illustrated at blocks 1230 and 1208/1212, processing of the cache injection request 610 is complete, the WI machine 414 allocated to the cache injection request 610 is released to return to the unbusy state, and the process illustrated in FIG. 12 returns via page connector D to block 1002 of FIG. 10.

With reference now to FIG. 13, the process proceeds from page connector C to block 1300, which illustrates L2 cache 230 determining whether it is currently able to process the cache injection request 610. For example, the determination shown at block 1300 may include a determination of whether or not all resources required to service the cache injection request 610, including a SN machine 314, are currently available for allocation to the cache injection request 610. In response to a determination at block 1300 that the L2 cache 230 is not currently able to process the cache injection request 610, the L2 cache 232 provides a Retry coherence response to the cache injection request 610 on the interconnect fabric (block 1302), requesting that the source of the cache injection request 610 re-issue the cache injection request 610 at a later time. Thereafter, the process of FIG. 13 ends at block 1320. It should be recalled that in this case, L2 cache 230 will not assert L2 I_OK to indicate that it can process the cache injection request 610, which will also cause the associated L3 cache 232 to terminate processing of the cache injection request 610, as discussed above with reference to block 1206.

Returning to block 1300, in response to a determination that L2 cache 230 is presently able to process the cache injection request 610, L2 cache 230 allocates the resources necessary to service the cache injection request 610, including a SN machine 314. The allocated SN machine 314 then utilizes WI channel 244 to signal the associated L3 cache 232 that the L2 cache 230 can service the cache injection request 610 by asserting L2 I_OK and by providing L3 cache 232 the SN ID of the allocated SN machine 314 (block 1304). The SN ID provided by the L2 cache 230 identifies which of the L2 D_rdy signals the WI machine 414 monitors at block 1220 of FIG. 12. The SN machine 314 then determines at block 1306 whether or not the associated L3 cache 232 has indicated that it can also service the cache injection request 610 by asserting L3 I_OK. If not, the SN machine 314 allocated to service the cache injection request 610 is released to return to an unbusy state, and the process of FIG. 13 ends at block 1320.

In response to an affirmative determination at block 1306, meaning that both the L2 cache 230 and L3 cache 232 are able to process the cache injection request 610, the process bifurcates and proceeds to blocks 1310 and 1312-1316 in parallel. At block 1310, SN machine 314 of L2 cache 230 updates the entry in L2 directory 308 associated with the target cache line of the cache injection request 610 to an invalid coherence state. In addition, at block 1312, arbiter 305 directs L2 array 302 via control path 330 to read out the target cache line into L2 CPI buffer 318. In response to the target cache line being placed into L2 CPI buffer 318, SN machine 314 asserts the appropriate one of L2 D_rdy signals at block 1314 to indicate to the L3 WI machine 414 in the associated L3 cache 232 that the target cache line of data is ready for transfer to the L3 cache 232 (see e.g., block 1220 of FIG. 12). SN machine 314 then awaits assertion by the L3 WI machine 414 of its associated L3 Done signal to indicate that the target cache line has been successfully transferred from L2 CPI buffer 318 to L3 cache 232 (block 1316). In response to completion of the processing depicted at blocks 1310 and 1316, the SN machine 314 is deallocated (returns to an unbusy state), and the process of FIG. 13 ends at block 1320.

Figure 14:
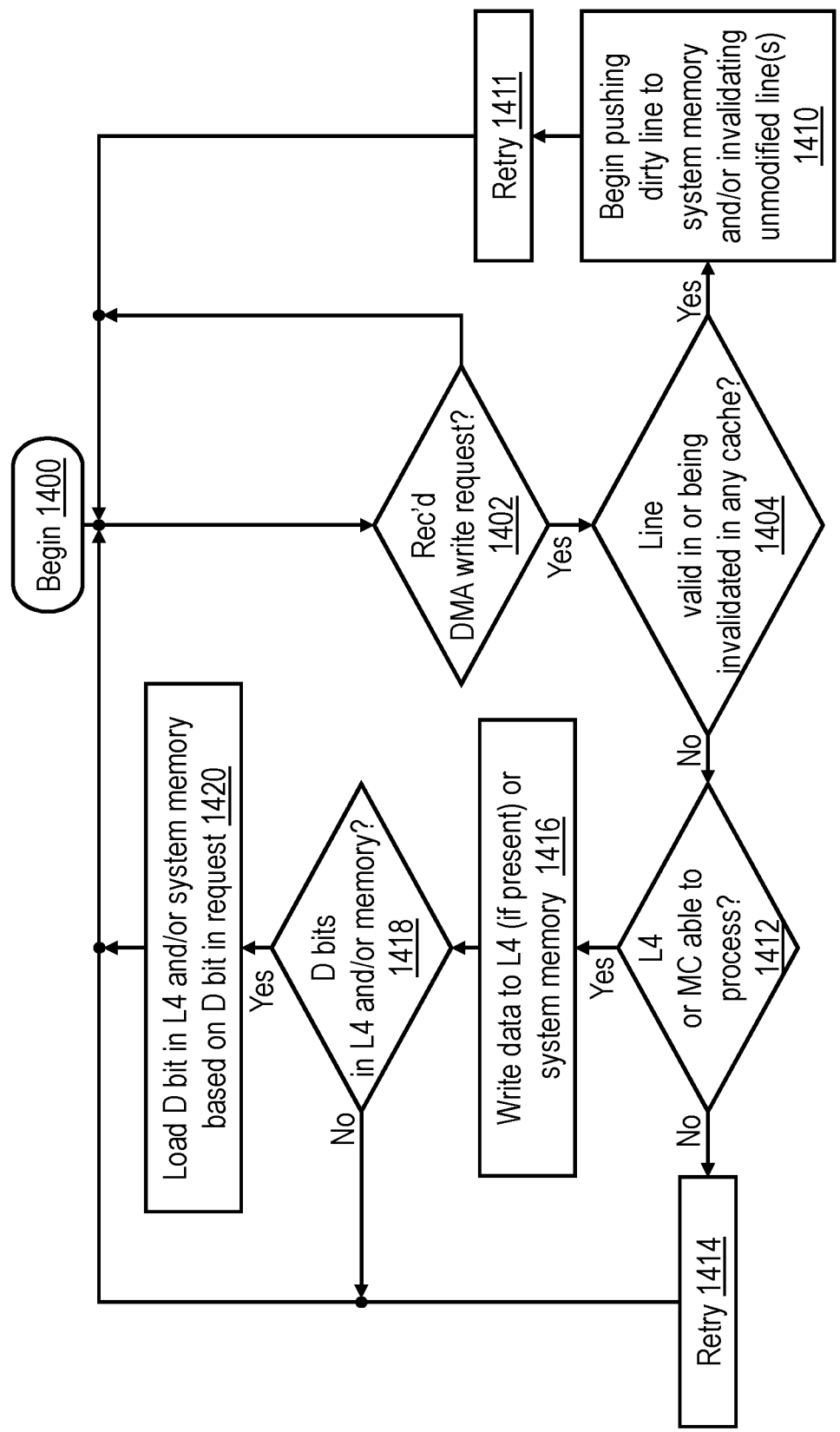
FIG. 14 is a high-level logical flowchart of an exemplary method of handling a DMA write request in accordance with one embodiment.

Referring now to FIG. 14, there is depicted is a high-level logical flowchart of an exemplary method of handling a DMA write request 600 in accordance with one embodiment. The process begins at block 1400 and then proceeds to block 1402, which illustrates a determination of whether or not a DMA write request 600 has been issued on the system fabric of data processing system 100. As noted above, the DMA write request 600 can be issued, for example, by an I/O controller 214 on behalf of an attached I/O device 218 in order to write a portion of a dataset of the I/O device 218 into a system memory 108 or L4 cache 234 of data processing system 100. If no DMA write request is issued at block 1402, the process continues to iterate at block 1402. However, in response to issuance of a DMA write request 600 at block 1402, the process proceeds to block 1404.

Block 1404 illustrates the different actions taken in data processing system 100 based on whether or not any cache 230, 232, or 234 holds a valid copy of the target cache line of the DMA write request 600 or is in the process of invalidating a valid copy of the target cache line. If so, each of the cache(s) holding a valid copy of the target cache line or in the process of invalidating a copy of the target cache line of the DMA write request 600 responds to the DMA write request by beginning to push any modified data, if present, associated with the target real address to the relevant system memory 108 and/or invalidating its copy of the target cache line (block 1410). In addition, each of these cache(s) provides a Retry coherence response on the system fabric indicating that the DMA write request 600 cannot complete successfully (block 1411). Following block 1411, the process of FIG. 14 returns to block 1402, which has been described. It should be appreciated that the I/O controller 214 may reissue the DMA write request 600 multiple times on the system fabric of data processing system 100 until any modified data associated with the target real address of the DMA write request 600 has been written back to the relevant system memory 108 and all cache copies of the target cache line have been invalidated, such that a negative determination is made at block 1404.

Based on a negative determination at block 1404, the process of FIG. 14 proceeds to block 1412, which illustrates an additional determination of whether the relevant memory controller 206 assigned the target real address of the DMA write request 600 or its associated L4 cache 234 (if present) is able to process the DMA write request 600. If not, the memory controller 206 and/or associated L4 cache 234 provides a Retry coherence response on the system fabric that prevents the DMA write request 600 from completing successfully (block 1414), and the process returns to block 1402. If, however, an affirmative determination is made at block 1412, the DMA write request 600 is serviced by the relevant L4 cache 234 (if present) or the relevant memory controller 206 by writing the data tenure associated with the DMA write request 600 into L4 array 236 or into system memory 108 (block 1416). As indicated by blocks 1418-1420, if D bits 210 are implemented in system memory 108 or a D field 508 is implemented in L4 directory 238, L4 cache 234 and/or memory controller 206 additionally loads the relevant D bit 210 and/or D field 508 with the value of D field 616 in the DMA write request 600. Thereafter, the process of FIG. 14 returns to block 1402.

Figure 15:
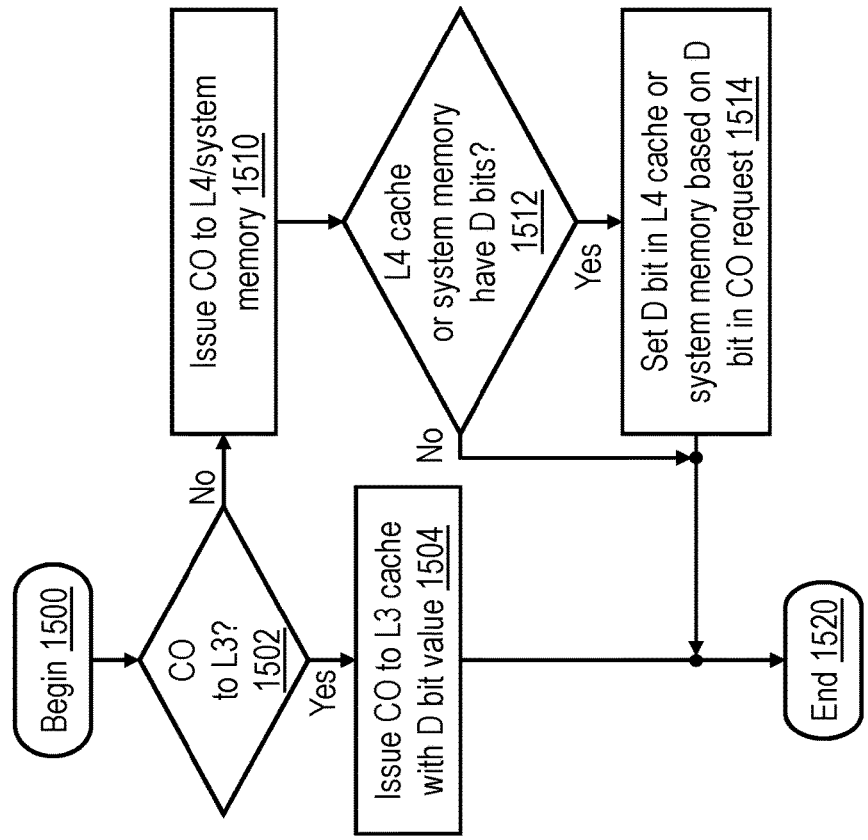
FIG. 15 is a high-level logical flowchart of an exemplary method by which an upper level (e.g., L2) cache performs a castout in accordance with one embodiment.

With reference now to FIG. 15, there is illustrated a high-level logical flowchart of an exemplary method by which an upper level (e.g., L2) cache performs a castout in accordance with one embodiment. The process of FIG. 15 begins at block 1500 and then proceeds to block 1502, for example, in response to a L2 cache 230 determining to evict a victim cache line from its L2 array 302 in order to accommodate a new cache line to be installed in L2 array 302. The process then proceeds to block 1502, which illustrates L2 cache 230 determining whether or not to castout the victim cache line to its associated L3 cache 232 or to instead castout the victim cache line to L4 cache 234 or system memory 108. In at least some embodiments, L2 cache 230 can make the determination shown at block 1502 based on one or more criteria, including the setting of the D field 508 of the directory entry in L2 directory 308 for the victim cache line. For example, the decision at block 1502 may be more biased to castout the victim cache line to the associated L3 cache 232 if D field 508 is set and may be less biased to castout the victim cache line to the associated L3 cache 232 if D field 508 is reset.

In response to a determination at block 1502 to castout the victim cache line to the associated L3 cache 232, L2 cache 230 issues a CO request 700 to the associated L3 cache 232 with the value of the associated D field 508 from the entry in L2 directory 308 in D field 706 of the CO request 700. In response, however, to a determination at block 1502 that the victim cache line is to be castout to a L4 cache 234 (if present) or system memory 108, L2 cache 230 issues a CO request 700 to the relevant L4 cache 234 or memory controller 206 via the system fabric, with the value of the associated D field 508 from the entry in L2 directory 308 in D field 706 of the CO request 700 (block 1510). In response to receipt of the CO request 700, the L4 cache 234 (if present) or memory controller 206 receives and stores the associated victim cache line. If L4 cache 234 is present, it will be appreciated that another cache line may be evicted from L4 directory 238 to create room to store the victim cache line. As indicated by block 1512-1514, if D bits 210 are implemented in system memory 108 or a D field 508 is implemented in L4 directory 238, L4 cache 234 and/or memory controller 206 additionally loads the relevant D bit 210 and/or D field 508 with the value of D field 706 in the CO request 700. Following block 1504 or blocks 1512-1514, the process of FIG. 15 ends at block 1520.

Figure 16:
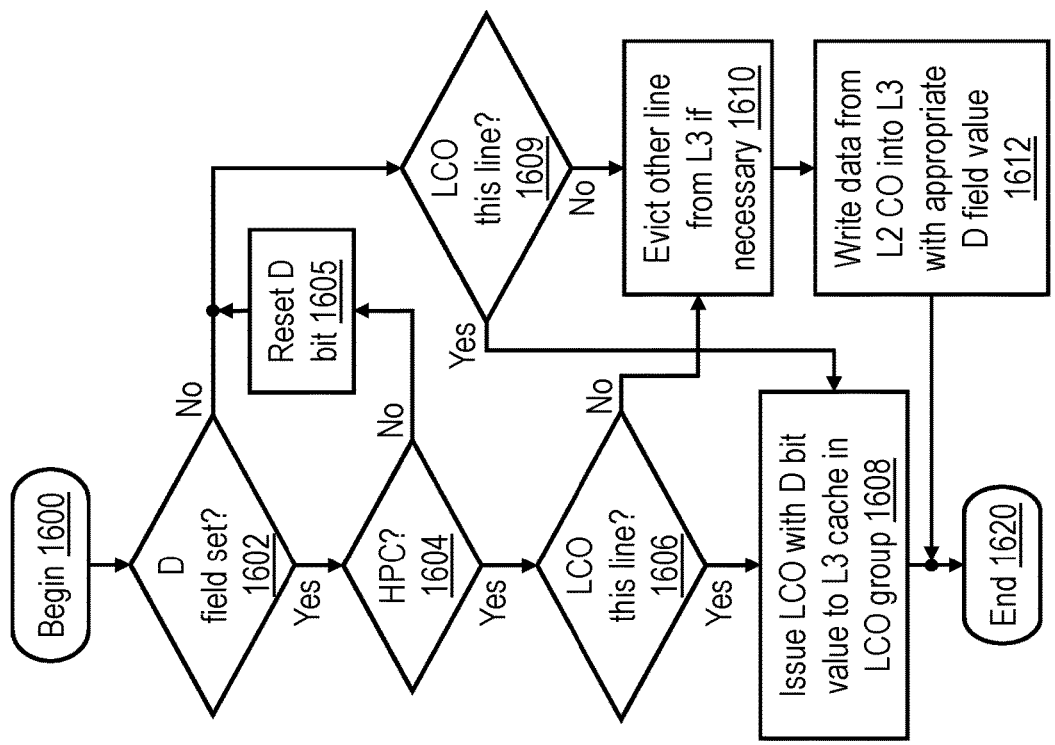
FIG. 16 is a high-level logical flowchart of an exemplary method by which a lower level (e.g., L3) cache handles a castout from an upper level (e.g., L2) cache in accordance with one embodiment.

Referring now to FIG. 16, there is depicted a high-level logical flowchart of an exemplary method by which a lower level (e.g., L3) cache handles a castout received from an upper level (e.g., L2) cache in accordance with one embodiment. The process of FIG. 16 begins at block 1600, for example, in response to receipt by a L3 cache 232 of a CO request 700 issued by its associated L2 cache 230, for example, at block 1504 of FIG. 15. In response to receipt of the CO request 700, the L3 cache 232 determines at block 1602 whether or not the D field 706 of the CO request 700 is set. If not, the processing of the CO request 700 proceeds to block 1609 and following blocks, which are described below. If, however, the L3 cache 232 determines at block 1602 that the D field 706 of the CO request 700 is set, L3 cache 232 additionally determines at block 1604 whether the state field 710 of CO request 700 indicates a HPC coherence state for the victim cache line. If not, L3 cache 232 resets the D field, and the process passes to block 1609, which is described below.

If, however, L3 cache 232 determines at block 1604 that state field 710 of CO request 700 indicates a HPC coherence state, L3 cache 232 also determines at block 1606 whether or not to make a lateral castout (LCO) of the victim cache line of data received from its associated L2 cache 230 to another L3 cache 230 in data processing system 100. As noted above, it is desirable for cache lines belonging to large datasets injected into the cache hierarchy of data processing system 100 (which are identified by a D field that is set) to be distributed among multiple vertical cache hierarchies rather than confined to the vertical cache hierarchy of a single processor core 200. Accordingly, in at least one embodiment, the L3 caches 232 of data processing system 100 are each assigned to a LCO group having N (e.g., 4, 8 or 16) L3 caches 232 as members. At block 1606 L3 cache 232 may determine, for example, to perform a LCO of the victim cache line received from its associated L2 cache 230 for N−1/N of the CO requests 700 received from its associated L2 cache 230 and to not perform a LCO of the victim cache line for 1/N of the CO requests 700 received from its associated L2 cache 230 in order to evenly distribute the victim cache lines across the LCO group. In response to L3 cache 232 determining at block 1606 to not perform a LCO for the victim cache line, the process passes to block 1610, which is described below. If, on the other hand, L3 cache 232 determines at block 1606 to perform a LCO for the victim cache line, L3 cache 232 selects a target L3 cache 232 (e.g., pseudo-randomly from among the other L3 caches 232 in the same LCO group) and issues a LCO request 720 to the target L3 cache 232 via the system fabric (block 1608). In the LCO request 720, valid field 722 is set, ttype field 724 specifies a LCO, D field 726 is set, address field 728 specifies the real address of the victim cache line received in address field 708 of CO request 700, state field 730 indicates the coherence state indicated by state field 710 of CO request 700, and target ID field 732 identifies the target L3 cache 232. An additional data tenure on the system fabric communicates the victim cache line data to the target L3 cache 232. It should be noted in this case that the source L3 cache 232 does not install the victim cache line in its L3 array 402. Following block 1608, the process of FIG. 16 ends at block 1620.

Referring now to block 1609, L3 cache 230 determines whether or not to perform a LCO for the victim cache line. As noted above, L3 cache 232 may determine, for example, to perform a LCO of the victim cache line received from its associated L2 cache 230 based on an indication provided by LCO heuristic logic 405. In response to an affirmative determination at block 1609, the process passes to block 1608, which has been described. In response to a negative determination at block 1609, L3 cache 232 evicts another cache line from L3 array 402 if needed to make room for the victim cache line received the associated L2 cache 230 (block 1610). At block 1612, L3 cache 232 writes the victim cache received in conjunction with the CO request 700 into L3 array 402, establishes the associated entry in L3 directory 408, and loads the appropriate value (obtained from D field 706) in the D field 508 of the entry in L3 directory 408. Following block 1612, the process of FIG. 16 ends at block 1620.

With reference now to FIG. 17, there is illustrated a high-level logical flowchart of an exemplary method by which a lower level (e.g., L3) cache performs a castout in accordance with one embodiment. The illustrated process can be performed, for example, at block 1610 of FIG. 16.

The process of FIG. 17 begins at block 1700, for example, based on a determination by a L3 cache 232 that a cache line in its L3 array 402 is to be evicted. The process proceeds to block 1702, which illustrates L3 cache 232 determining whether or not the eviction of the cache line is necessitated by a LCO request 720 (issued, for example, at block 1608 of FIG. 16) targeting this L3 cache 232. If so, a CO request 700 will be utilized to communicate the L4 cache 234 and/or system memory 108, and the process passes to block 1710 and following blocks, which are described below. If, however, L3 cache 232 determines at block 1702 that the eviction of the cache line is not necessitated by a LCO request 720, L3 cache 232 determines at block 1704 whether or not to perform a LCO of the victim cache line to another L3 cache 232 or to perform a CO of the victim cache line to L4 cache 234 or system memory 108. Arbiter 404 of L3 cache 232b may make the determination illustrated at block 1704 based on the indication provided by LCO heuristic logic 405. In response to a determination at block 1704 to perform a LCO for the victim cache line, L3 cache 232 selects a target L3 cache 232 (e.g., pseudo-randomly from among the other L3 caches 232 in the same LCO group) and issues a LCO request 720 on the system fabric (block 1706). In the LCO request 720, valid field 722 is set, ttype field 724 specifies a LCO, D field 726 has the value in the D field 508 of the relevant entry in L3 directory 408, address field 728 specifies the real address of the victim cache line evicted from L3 cache 232, state field 730 indicates the coherence state indicated by state field 506 of the relevant entry in L3 directory 408, and target ID field 732 identifies the target L3 cache 232. Following block 1706, the process of FIG. 17 ends at block 1720.

Referring now to block 1710, L3 cache 232 issues a CO request 700 to the relevant L4 cache 234 or system memory 108 via the system fabric, with the value of the associated D field 508 from the entry in L3 directory 408 in D field 706 of the CO request 700. The victim cache line data is transmitted via the system fabric in an additional data tenure. In response to the CO request 700 and victim cache line data, the L4 cache 234 or memory controller 206 writes the victim cache line data into L4 array 236 or system memory 108. If L4 cache 234 is present, it will be appreciated that another cache line may be evicted from L4 directory 238 to create room to store the victim cache line.

As further indicated by blocks 1712-1714, if D bits 210 are implemented in system memory 108 or a D field 508 is implemented in L4 directory 238, L4 cache 234 and/or memory controller 206 additionally loads the relevant D bit 210 and/or D field 508 with the value of D field 706 in the CO request 700. Following block 1712 or block 1714, the process of FIG. 17 ends at block 1720.

Referring now to FIG. 18, there is depicted a high-level logical flowchart of an exemplary method by which a lowest level (e.g., L4) cache, if present, performs a castout in accordance with one embodiment. The process of FIG. 18 begins at block 1800, for example, based on a determination by a L4 cache 234 that a cache line in its L4 array 236 is to be evicted, for example, due to a CO request issued at block 1510 or block 1710.

The process proceeds from block 1800 to block 1802, which illustrates L4 cache 234 performing different actions based on whether or not L4 directory 238 implements D field 508. If not, L4 cache 234 issues a CO request 700 (optionally omitting D field 706) to the memory controller 206 of the associated system memory 108 to cause the evicted cache line (communicated in a separate data tenure) to be written into the system memory 108 (block 1810). Thereafter, L4 cache 234 invalidates its copy of the victim cache line in L4 directory 238 (block 1808), and the process of FIG. 18 ends at block 1812.

Returning to block 1802, if the entries of L4 directory 238 implements D fields 508 and system memory 108 implements D bits 210, L4 cache 234 issues a CO request 700 to the memory controller 206 of the associated system memory 108, with the value of the D field 508 from the entry in L4 directory 238 in D field 706 of the CO request 700 (block 1806). The victim cache line data is transmitted to the memory controller 206 in an additional data tenure. Thereafter, L4 cache 234 invalidates its copy of the victim cache line in L4 directory 238 (block 1808), and the process of FIG. 18 ends at block 1812.

Figure 19:
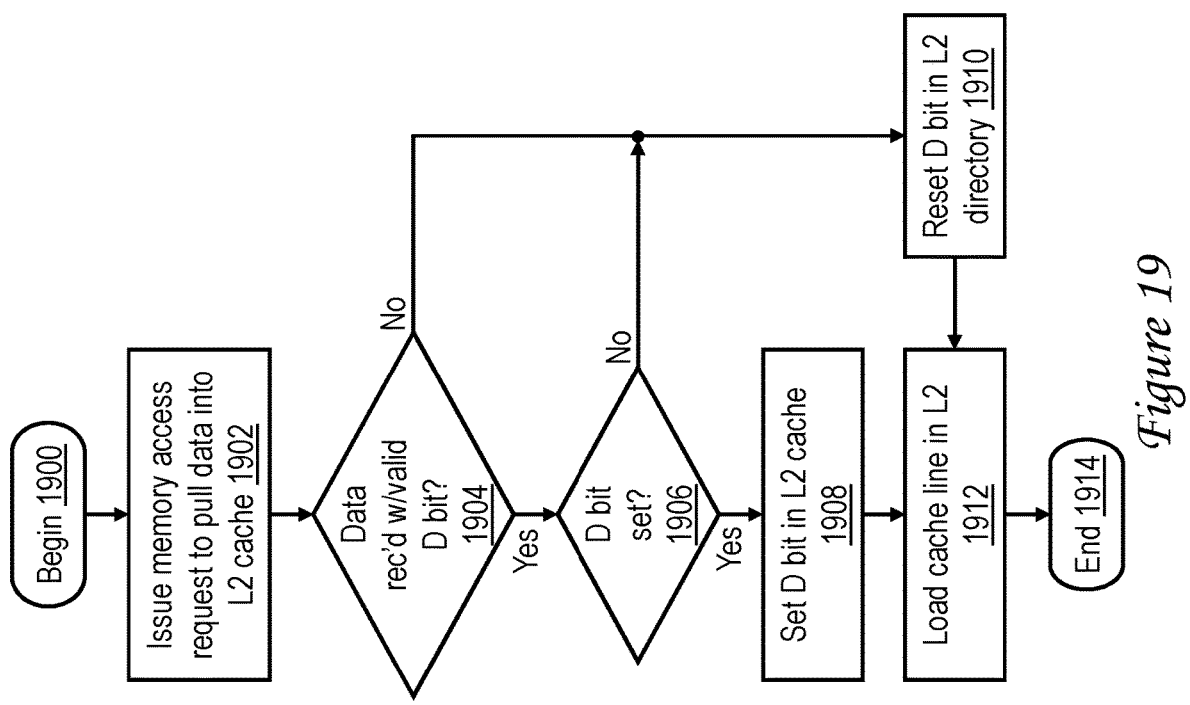
FIG. 19 is a high-level logical flowchart of an exemplary method by which an upper level (e.g., L2) cache pulls data into its array in accordance with one embodiment.

With reference now to FIG. 19, there is illustrated a high-level logical flowchart of an exemplary method by which an upper level (e.g., L2) cache pulls data into its array in accordance with one embodiment. The process begins at block 1900, for example, in response to an L2 cache 230 determining that a cache line of data requested by its associated processor core 200 is not present in that L2 cache 230 or its associated L3 cache 232 in a required coherence state. The process then proceeds to block 1902, which illustrates an L2 cache 230 issuing on the system fabric a memory access request (e.g., a read or read-with-intent-to-modify request) to pull an existing copy of a target cache line into its L2 array 302. In response to the memory access request (or a re-issue of the memory access request), L2 cache 230 receives, in a data tenure on the system fabric, a cache line of data specified by a target real address in the memory access request. In various operating scenarios, the cache line of data may be sourced, for example, from L4 cache 234 (if present) or memory controller 206 or from an L2 cache 230 or L3 cache 232. Depending on the data source and whether or not D fields/D bits are implemented in L4 cache 234/system memory 108, the data tenure or a coherence message associated with the memory access request can convey a setting of a D field associated with the requested cache line of data.

At block 1904, the requesting L2 cache 232 determines whether or not the cache line data was received in conjunction with a D bit. If not, L2 cache 232 installs the cache line of data into L2 array 302, establishes a corresponding entry in L2 directory 308, and resets D field 508 in the directory entry (blocks 1910 and 1912). Thereafter, the process of FIG. 19 ends at block 1914.

Returning to block 1904, in response to a determination that a D bit was received in conjunction with the cache line data, L2 cache 230 additionally determines at block 1906 whether or not the D bit is set. If not, the process passes to blocks 1910-1912, which have been described. If, however, L2 cache 230 determines at block 1906 that the D bit received in conjunction with the cache line data was set, L2 cache 232 installs the cache line of data into L2 array 302, establishes a corresponding entry in L2 directory 308, and sets D field 508 in the directory entry (blocks 1908 and 1912). Thereafter, the process of FIG. 19 ends at block 1914

Figure 20:
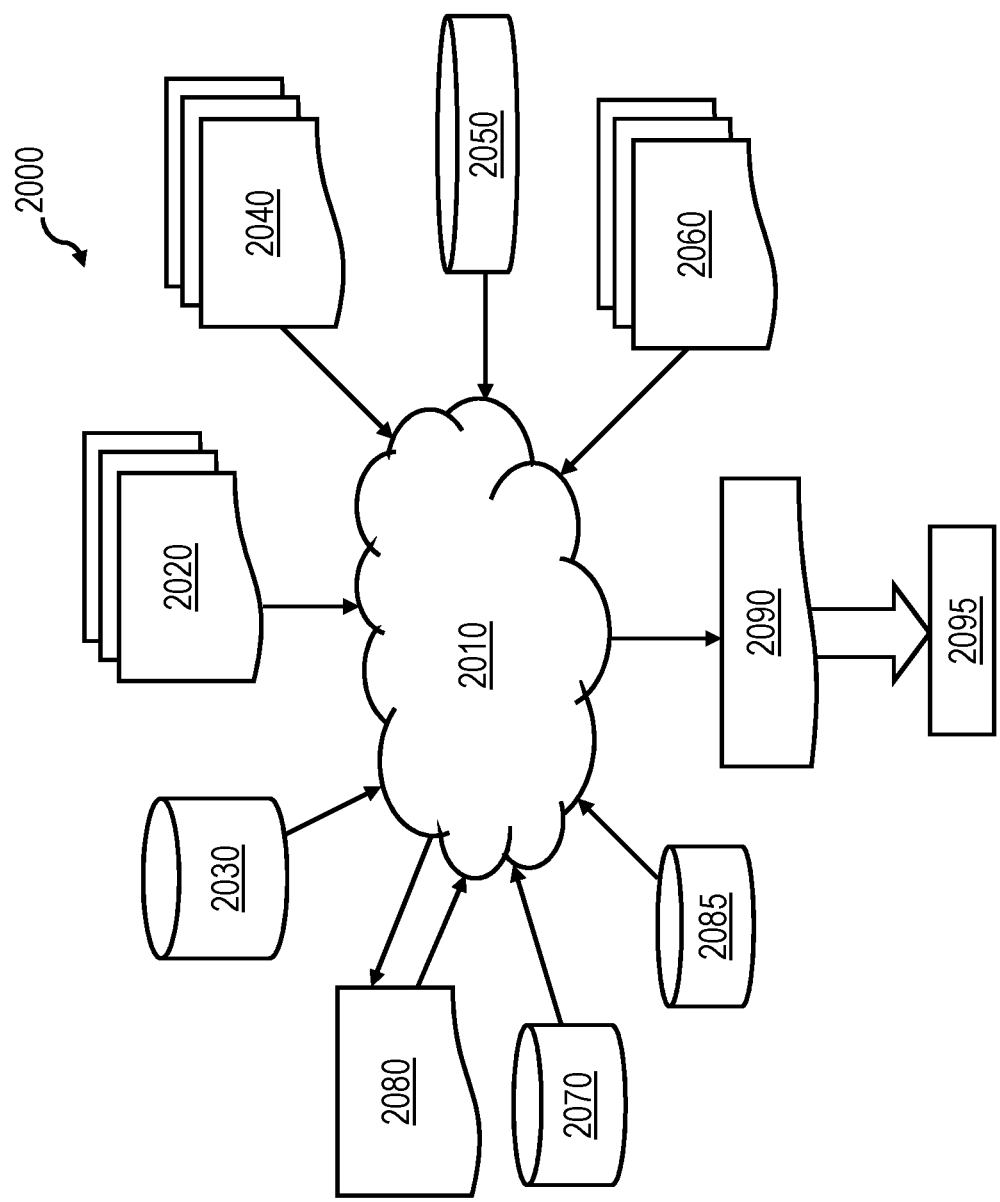
FIG. 20 is a data flow diagram illustrating a design process.

With reference now to FIG. 20, there is depicted a block diagram of an exemplary design flow 2000 used for example, in semiconductor IC logic design, simulation, test, layout, and manufacture. Design flow 2000 includes processes, machines and/or mechanisms for processing design structures or devices to generate logically or otherwise functionally equivalent representations of the design structures and/or devices described above and shown herein. The design structures processed and/or generated by design flow 2000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 2000 may vary depending on the type of representation being designed. For example, a design flow 2000 for building an application specific IC (ASIC) may differ from a design flow 2000 for designing a standard component or from a design flow 2000 for instantiating the design into a programmable array, for example a programmable gate array (PGA) or a field programmable gate array (FPGA) offered by Altera® Inc. or Xilinx® Inc.

FIG. 20 illustrates multiple such design structures including an input design structure 2020 that is preferably processed by a design process 2010. Design structure 2020 may be a logical simulation design structure generated and processed by design process 2010 to produce a logically equivalent functional representation of a hardware device. Design structure 2020 may also or alternatively comprise data and/or program instructions that when processed by design process 2010, generate a functional representation of the physical structure of a hardware device. Whether representing functional and/or structural design features, design structure 2020 may be generated using electronic computer-aided design (ECAD) such as implemented by a core developer/designer. When encoded on a machine-readable data transmission, gate array, or storage medium, design structure 2020 may be accessed and processed by one or more hardware and/or software modules within design process 2010 to simulate or otherwise functionally represent an electronic component, circuit, electronic or logic module, apparatus, device, or system such as those shown herein. As such, design structure 2020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2010 preferably employs and incorporates hardware and/or software modules for synthesizing, translating, or otherwise processing a design/simulation functional equivalent of the components, circuits, devices, or logic structures shown herein to generate a netlist 2080 which may contain design structures such as design structure 2020. Netlist 2080 may comprise, for example, compiled or otherwise processed data structures representing a list of wires, discrete components, logic gates, control circuits, I/O devices, models, etc. that describes the connections to other elements and circuits in an integrated circuit design. Netlist 2080 may be synthesized using an iterative process in which netlist 2080 is resynthesized one or more times depending on design specifications and parameters for the device. As with other design structure types described herein, netlist 2080 may be recorded on a machine-readable storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, or buffer space.

Design process 2010 may include hardware and software modules for processing a variety of input data structure types including netlist 2080. Such data structure types may reside, for example, within library elements 2030 and include a set of commonly used elements, circuits, and devices, including models, layouts, and symbolic representations, for a given manufacturing technology (e.g., different technology nodes, 32 nm, 45 nm, 200 nm, etc.). The data structure types may further include design specifications 2040, characterization data 2050, verification data 2060, design rules 2070, and test data files 2085 which may include input test patterns, output test results, and other testing information. Design process 2010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 2010 without deviating from the scope and spirit of the invention. Design process 2010 may also include modules for performing standard circuit design processes such as timing analysis, verification, design rule checking, place and route operations, etc.

Design process 2010 employs and incorporates logic and physical design tools such as HDL compilers and simulation model build tools to process design structure 2020 together with some or all of the depicted supporting data structures along with any additional mechanical design or data (if applicable), to generate a second design structure 2090. Design structure 2090 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 2020, design structure 2090 preferably comprises one or more files, data structures, or other computer-encoded data or instructions that reside on transmission or data storage media and that when processed by an ECAD system generate a logically or otherwise functionally equivalent form of one or more of the embodiments of the invention shown herein. In one embodiment, design structure 2090 may comprise a compiled, executable HDL simulation model that functionally simulates the devices shown herein.

Design structure 2090 may also employ a data format used for the exchange of layout data of integrated circuits and/or symbolic data format (e.g., information stored in a GDSII (GDS2), GL1, OASIS, map files, or any other suitable format for storing such design data structures). Design structure 2090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown herein. Design structure 2090 may then proceed to a stage 2095 where, for example, design structure 2090: proceeds to tape-out, is released to manufacturing, is released to a mask house, is sent to another design house, is sent back to the customer, etc.

As has been described, in at least one embodiment, a data processing system includes a plurality of processor cores each supported by a respective one of a plurality of vertical cache hierarchies. Based on receiving on a system fabric a cache injection request requesting injection of a data into a cache line identified by a target real address, the data is written into a cache in a first vertical cache hierarchy among the plurality of vertical cache hierarchies. Based on a value in a field of the cache injection request, a distribute field is set in a directory entry of the first vertical cache hierarchy. Upon eviction of the cache line the first vertical cache hierarchy, a determination is made whether the distribute field is set. Based on determining the distribute field is set, a lateral castout of the cache line from the first vertical cache hierarchy to a second vertical cache hierarchy is performed.

While various embodiments have been particularly shown and described, it will be understood by those skilled in the art that various changes in form and detail may be made therein without departing from the spirit and scope of the appended claims and these alternate implementations all fall within the scope of the appended claims. For example, although aspects have been described with respect to a computer system executing program code that directs the functions of the present invention, it should be understood that present invention may alternatively be implemented as a program product including a computer-readable storage device storing program code that can be processed by a data processing system. The computer-readable storage device can include volatile or non-volatile memory, an optical or magnetic disk, or the like, but excludes non-statutory subject matter, such as propagating signals per se, transmission media per se, and forms of energy per se.

As an example, the program product may include data and/or instructions that when executed or otherwise processed on a data processing system generate a logically, structurally, or otherwise functionally equivalent representation (including a simulation model) of hardware components, circuits, devices, or systems disclosed herein. Such data and/or instructions may include hardware-description language (HDL) design entities or other data structures conforming to and/or compatible with lower-level HDL design languages such as Verilog and VHDL, and/or higher level design languages such as C or C++. Furthermore, the data and/or instructions may also employ a data format used for the exchange of layout data of integrated circuits and/or symbolic data format (e.g. information stored in a GDSII (GDS2), GL1, OASIS, map files, or any other suitable format for storing such design data structures).

What is claimed is:

1. A method of data processing in a data processing system including a plurality of processor cores each supported by a respective one of a plurality of vertical cache hierarchies, the method comprising:
    based on receiving on a system fabric of the data processing system a cache injection request requesting injection of a data into a cache line identified by a target real address, writing the data into a cache in a first vertical cache hierarchy among the plurality of vertical cache hierarchies;
    based on a value in a field of the cache injection request, setting a distribute field in a directory entry of the first vertical cache hierarchy;
    upon eviction of the cache line from a cache memory in the first vertical cache hierarchy, determining whether the distribute field is set; and
    based on determining the distribute field is set, performing a lateral castout of the cache line from the first vertical cache hierarchy to a second vertical cache hierarchy among the plurality of vertical cache hierarchies.

2. The method of claim 1, wherein performing the lateral castout based on determining the distribute field is set comprises performing the lateral castout based on determining the distribute field is set only if the cache line is held by the cache memory in a coherence state providing write authority.

3. The method of claim 1, wherein:
    the method further comprises evicting the cache line from an upper level cache in the first vertical cache hierarchy;
    performing the lateral castout includes a lower level cache in the first vertical cache hierarchy receiving the cache line upon eviction from the upper level cache and issuing a lateral castout request targeting the second vertical cache hierarchy without installing the cache line in a data array of the lower level cache.

4. The method of claim 1, wherein:
    a processor core among the plurality of processor cores is supported by the first vertical cache hierarchy;
    the method further comprises:
        prior to receiving the cache injection request at the first vertical cache hierarchy, executing, by the processor core, an instruction to cause the cache line to be installed in the first vertical cache hierarchy in a coherence state providing write authority.

5. The method of claim 1, wherein performing the lateral castout includes:
    transmitting, in a lateral castout request on the system fabric of the data processing system, a distribute field that is set;
    transmitting the cache line on the system fabric; and
    installing the cache line in a data array in the second vertical cache hierarchy and, based on the distribute field in the lateral castout request being set, setting a distribute field in a directory entry of the second vertical cache hierarchy.

6. The method of claim 1, wherein:
    the data processing system includes a system memory;
    the method further comprising:
        thereafter, casting out the data of the cache line from the second vertical cache hierarchy to the system memory and storing the distribute field in the system memory in association with the data.

7. A processing unit for a data processing system, comprising:
- a processor core;
- a vertical cache hierarchy coupled to the processor core and configured to be coupled to a system fabric of the data processing system, wherein the vertical cache hierarchy includes a cache having a data array and a directory and is configured to perform:
    - based on receiving on the system fabric of the data processing system a cache injection request requesting injection of a data into a cache line identified by a target real address, writing the data into the data array in the vertical cache hierarchy;
    - based on a value in a field of the cache injection request, setting a distribute field in a directory entry of the directory;
    - upon eviction of the cache line from the first vertical cache hierarchy, determining whether the distribute field is set; and
    - based on determining the distribute field is set, performing a lateral castout of the cache line from the vertical cache hierarchy to another vertical cache hierarchy in the data processing system.

8. The processing unit of claim 7, wherein performing the lateral castout based on determining the distribute field is set comprises performing the lateral castout based on determining the distribute field is set only if the cache line is held by the cache memory in a coherence state providing write authority.

9. The processing unit of claim 7, wherein:
- the cache is an upper level cache;
- the vertical cache hierarchy includes a lower level cache;
- performing the lateral castout includes a lower level cache receiving the cache line upon eviction from the upper level cache and issuing a lateral castout request targeting said another vertical cache hierarchy without installing the cache line in the lower level cache.

10. The processing unit of claim 7, wherein:
- the processor core, prior to receipt of the cache injection request, executes an instruction to cause the cache line to be installed in the first vertical cache hierarchy in a coherence state providing write authority.

11. The processing unit of claim 7, wherein performing the lateral castout includes:
- transmitting the cache line on the system fabric; and
- transmitting, in a lateral castout request on the system fabric of the data processing system, a distribute field that is set, wherein the distribute field being set causes a distribute field to be set in a directory entry associated with the cache line in the second vertical cache hierarchy.

12. A data processing system, comprising:
- a plurality of processing units in accordance with claim 7;
- an interconnect fabric coupling the plurality of processing units; and
- a system memory communicatively coupled to the interconnect fabric.

13. The data processing system of claim 12, further comprising a memory controller that, responsive to a castout of the data of the cache line from the second vertical cache hierarchy, installs the data in the system memory and stores the distribute field in the system memory in association with the data.

14. A design structure tangibly embodied in a machine-readable storage medium for designing, manufacturing, or testing an integrated circuit, the design structure comprising:
- a processing unit for a data processing system, including:
    - a processor core;
    - a vertical cache hierarchy coupled to the processor core and configured to be coupled to a system fabric of the data processing system, wherein the vertical cache hierarchy includes a cache having a data array and a directory and is configured to perform:
        - based on receiving on the system fabric of the data processing system a cache injection request requesting injection of a data into a cache line identified by a target real address, writing the data into the data array in the vertical cache hierarchy;
        - based on a value in a field of the cache injection request, setting a distribute field in a directory entry of the directory;
        - upon eviction of the cache line from the first vertical cache hierarchy, determining whether the distribute field is set; and
        - based on determining the distribute field is set, performing a lateral castout of the cache line from the vertical cache hierarchy to another vertical cache hierarchy in the data processing system.

15. The design structure of claim 14, wherein performing the lateral castout based on determining the distribute field is set comprises performing the lateral castout based on determining the distribute field is set only if the cache line is held by the cache memory in a coherence state providing write authority.

16. The design structure of claim 14, wherein:
- the cache is an upper level cache;
- the vertical cache hierarchy includes a lower level cache;
- performing the lateral castout includes a lower level cache receiving the cache line upon eviction from the upper level cache and issuing a lateral castout request targeting said another vertical cache hierarchy without installing the cache line in the lower level cache.

17. The design structure of claim 14, wherein:
- the processor core, prior to receipt of the cache injection request, executes an instruction to cause the cache line to be installed in the first vertical cache hierarchy in a coherence state providing write authority.

18. The design structure of claim 14, wherein performing the lateral castout includes:
- transmitting the cache line on the system fabric; and
- transmitting, in a lateral castout request on the system fabric of the data processing system, a distribute field that is set, wherein the distribute field being set causes a distribute field to be set in a directory entry associated with the cache line in the second vertical cache hierarchy.

19. The design structure of claim 14, wherein the design structure comprises a hardware description language (HDL) design structure.

* * * * *